(12) United States Patent
Cui et al.

(10) Patent No.: US 10,741,579 B2
(45) Date of Patent: Aug. 11, 2020

(54) THREE-DIMENSIONAL MEMORY DEVICE INCLUDING DIFFERENT HEIGHT MEMORY STACK STRUCTURES AND METHODS OF MAKING THE SAME

(71) Applicant: SANDISK TECHNOLOGIES LLC, Addison, TX (US)

(72) Inventors: Zhixin Cui, Nagoya (JP); Masatoshi Nishikawa, Nagoya (JP); Ken Oowada, Fujisawa (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/215,912

(22) Filed: Dec. 11, 2018

(65) Prior Publication Data

US 2020/0185405 A1 Jun. 11, 2020

(51) Int. Cl.
*H01L 27/11582* (2017.01)
*H01L 29/08* (2006.01)
(Continued)

(52) U.S. Cl.
CPC ... *H01L 27/11582* (2013.01); *H01L 21/31111* (2013.01); *H01L 21/76224* (2013.01);
(Continued)

(58) Field of Classification Search
CPC ......... H01L 27/11582; H01L 27/11556; H01L 27/11521; H01L 27/11519; H01L 27/11565; H01L 27/11568; H01L 29/7926; H01L 29/7889; H01L 21/31111; H01L 21/76224
See application file for complete search history.

(56) References Cited

U.S. PATENT DOCUMENTS

| 5,915,167 A | 6/1999 | Leedy |
| 10,290,643 B1 * | 5/2019 | Kai ..................... H01L 27/1157 |

(Continued)

OTHER PUBLICATIONS

U.S. Appl. No. 15/850,073, filed Dec. 21, 2017, SanDisk Technologies LLC.

(Continued)

*Primary Examiner* — Hsien Ming Lee
(74) *Attorney, Agent, or Firm* — The Marbury Law Group, PLLC

(57) ABSTRACT

A three-dimensional memory device includes an alternating stack of insulating layers and electrically conductive layers located over a substrate. The alternating stack includes a first region in which all layers of the alternating stack are present and a second region in which at least a topmost one of the electrically conductive layers is absent. First memory opening fill structures extend through the first region of the alternating stack, and second memory opening fill structures extend through the second region of the alternating stack. The first memory opening fill structures have a greater height than the second memory opening fill structures. Pocket doping regions extending over a respective subset of topmost electrically conductive layers for the memory opening fill structures can be formed to provide higher threshold voltages and to enable selective activation of vertical semiconductor channels connected a same bit line.

20 Claims, 38 Drawing Sheets

(51) Int. Cl.
| | |
|---|---|
| H01L 29/10 | (2006.01) |
| H01L 29/06 | (2006.01) |
| H01L 23/528 | (2006.01) |
| H01L 21/311 | (2006.01) |
| H01L 21/762 | (2006.01) |
| H01L 27/11519 | (2017.01) |
| H01L 27/11565 | (2017.01) |
| H01L 27/11556 | (2017.01) |
| H01L 21/28 | (2006.01) |
| H01L 21/265 | (2006.01) |
| H01L 21/02 | (2006.01) |
| H01L 21/3105 | (2006.01) |
| H01L 21/027 | (2006.01) |
| H01L 29/51 | (2006.01) |
| H01L 29/788 | (2006.01) |
| H01L 29/792 | (2006.01) |
| H01L 29/36 | (2006.01) |
| H01L 21/306 | (2006.01) |

(52) U.S. Cl.
CPC ...... *H01L 23/528* (2013.01); *H01L 27/11519* (2013.01); *H01L 27/11556* (2013.01); *H01L 27/11565* (2013.01); *H01L 29/0649* (2013.01); *H01L 29/0847* (2013.01); *H01L 29/1037* (2013.01); *H01L 29/40114* (2019.08); *H01L 29/40117* (2019.08); *H01L 21/0262* (2013.01); *H01L 21/0273* (2013.01); *H01L 21/02164* (2013.01); *H01L 21/02214* (2013.01); *H01L 21/02271* (2013.01); *H01L 21/02532* (2013.01); *H01L 21/02592* (2013.01); *H01L 21/26513* (2013.01); *H01L 21/30625* (2013.01); *H01L 21/31053* (2013.01); *H01L 21/31116* (2013.01); *H01L 29/36* (2013.01); *H01L 29/513* (2013.01); *H01L 29/517* (2013.01); *H01L 29/518* (2013.01); *H01L 29/7883* (2013.01); *H01L 29/7889* (2013.01); *H01L 29/7926* (2013.01)

(56) References Cited

U.S. PATENT DOCUMENTS

| | | |
|---|---|---|
| 2017/0278571 A1 | 9/2017 | Chowdhury et al. |
| 2018/0233513 A1 | 8/2018 | Zhang et al. |

OTHER PUBLICATIONS

Endoh et al., "Novel Ultra High Density Memory with a Stacked-Surrounding Gate Transistor (S-SGT) Structured Cell," IEDM Proc., (2001), 33-36.

* cited by examiner

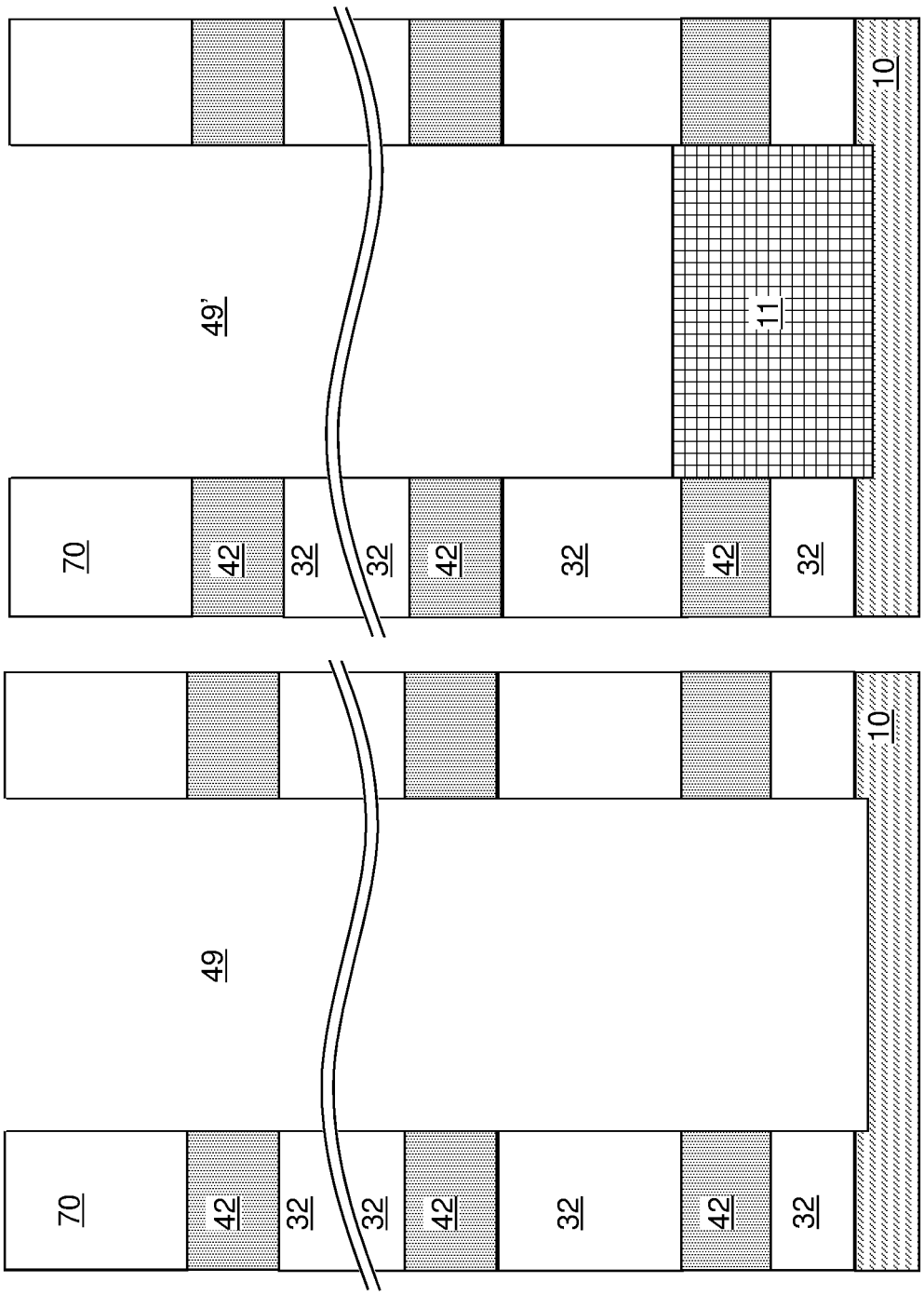

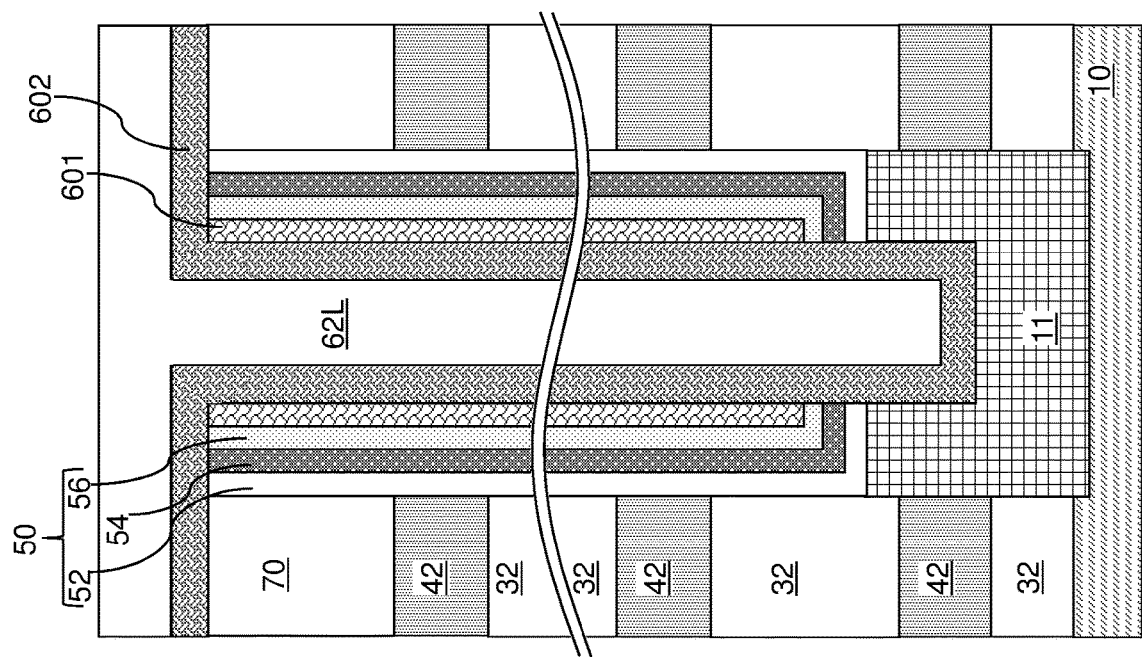
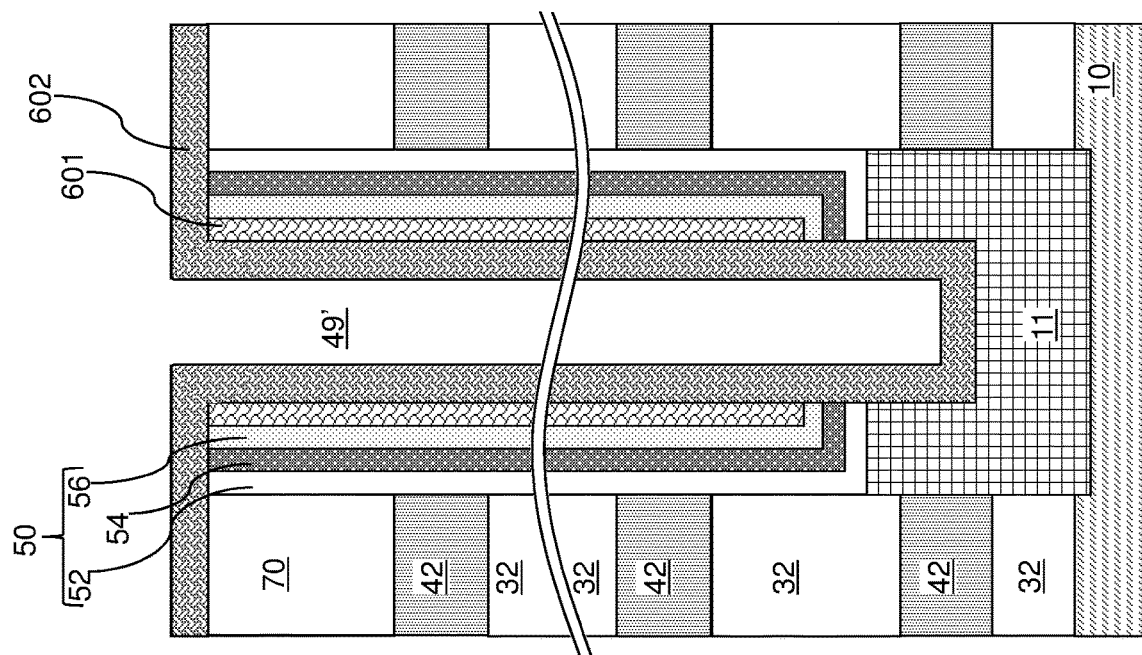

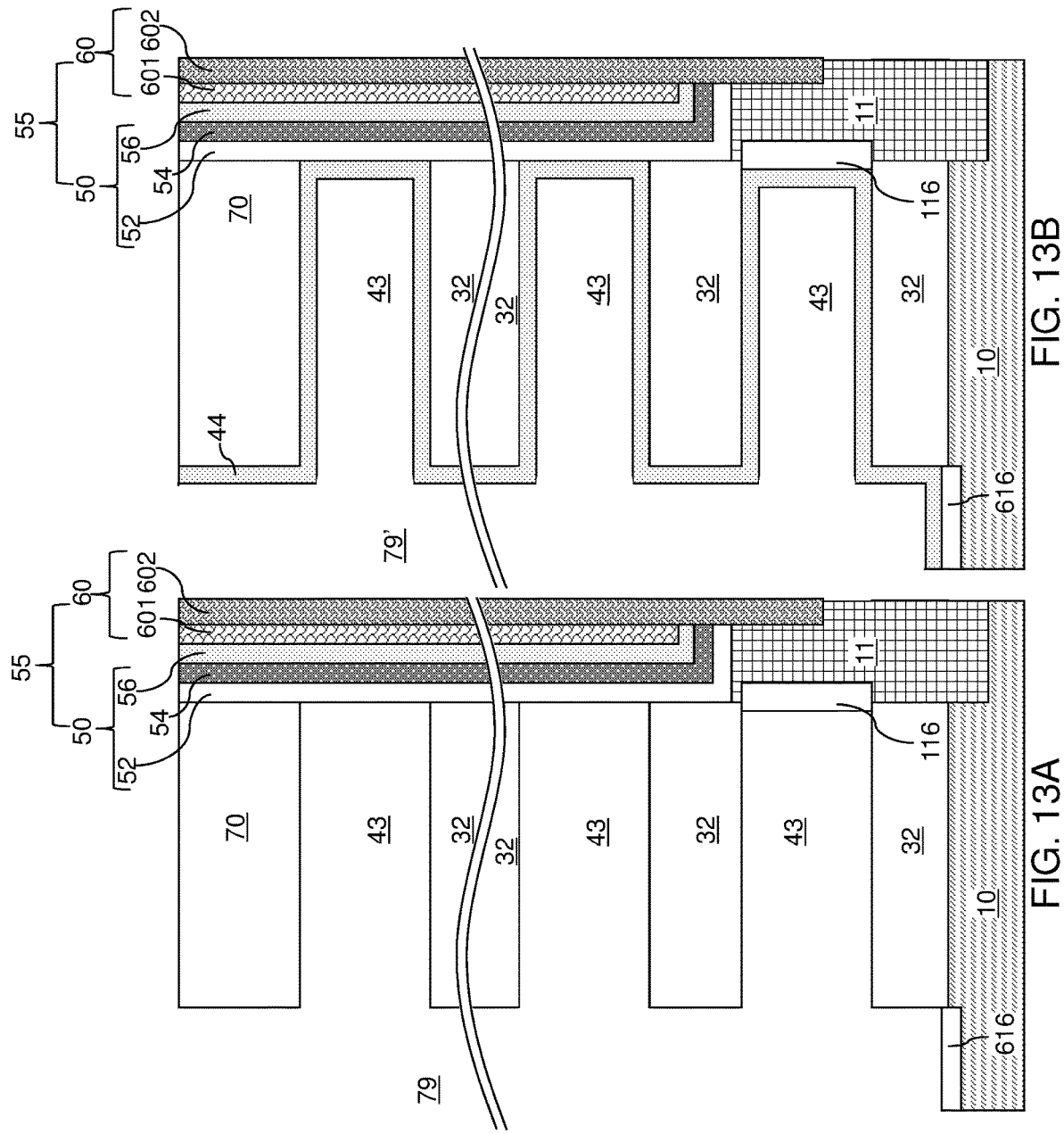

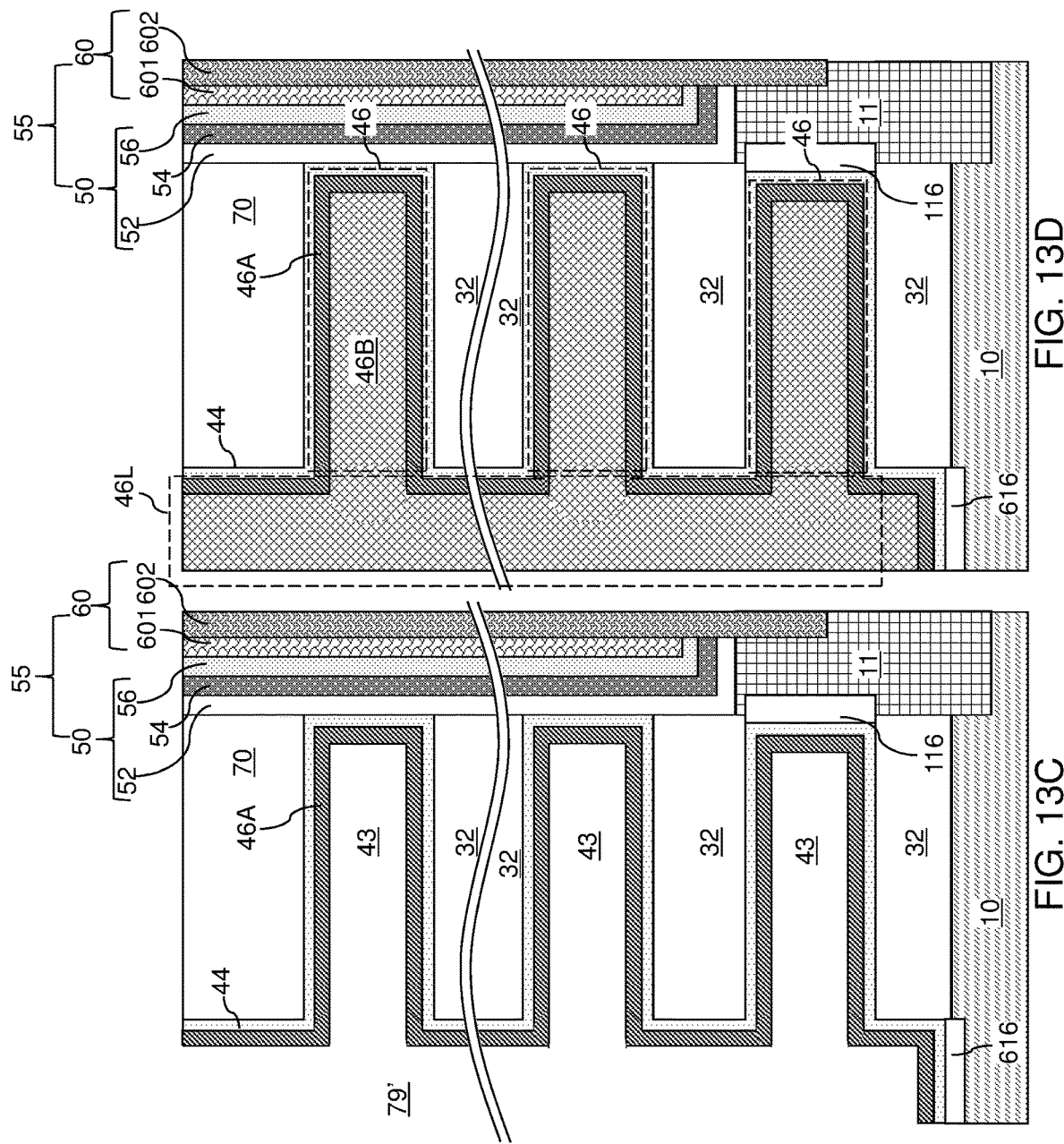

THREE-DIMENSIONAL MEMORY DEVICE INCLUDING DIFFERENT HEIGHT MEMORY STACK STRUCTURES AND METHODS OF MAKING THE SAME

FIELD

The present disclosure relates generally to the field of semiconductor devices, and particular to a three-dimensional memory device including different height memory stack structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the alternating stack includes a first region in which all layers of the alternating stack are present and a second region in which at least a topmost one of the electrically conductive layers is absent; first memory opening fill structures extending through the first region of the alternating stack; and second memory opening fill structures extending through the second region of the alternating stack, wherein each of the first memory opening fill structures and the second memory opening fill structures comprises a respective memory film and a respective vertical semiconductor channel that is laterally surrounded by the respective memory film.

According to another aspect of the present disclosure, a method of forming a three-dimensional memory device is provided, which comprises: forming an alternating stack of insulating layers and spacer material layers, wherein the spacer material layers are formed as, or are subsequently replaced with, electrically conductive layers; forming a recess region within the alternating stack by masking a first region of the alternating stack and recessing a second region of the alternating stack to remove at least one spacer material layer from the second region; forming memory opening fill structures through the alternating stack, wherein the memory opening fill structures comprise first memory opening fill structures extending through the first region of the alternating stack and second memory opening fill structures extending through the second region of the alternating stack, wherein each of the first memory opening fill structures and the second memory opening fill structures comprises a respective memory film and a respective vertical semiconductor channel that is laterally surrounded by the respective memory film.

BRIEF DESCRIPTION OF THE DRAWINGS

FIGS. 9A-9H are sequential schematic vertical cross-sectional views of a memory opening within the exemplary structure during formation of a memory stack structure, an optional dielectric core, and a drain region therein according to an embodiment of the present disclosure.

FIGS. 13A-13D are sequential vertical cross-sectional views of a region of the exemplary structure during formation of electrically conductive layers according to an embodiment of the present disclosure.

DETAILED DESCRIPTION

Figure 1:
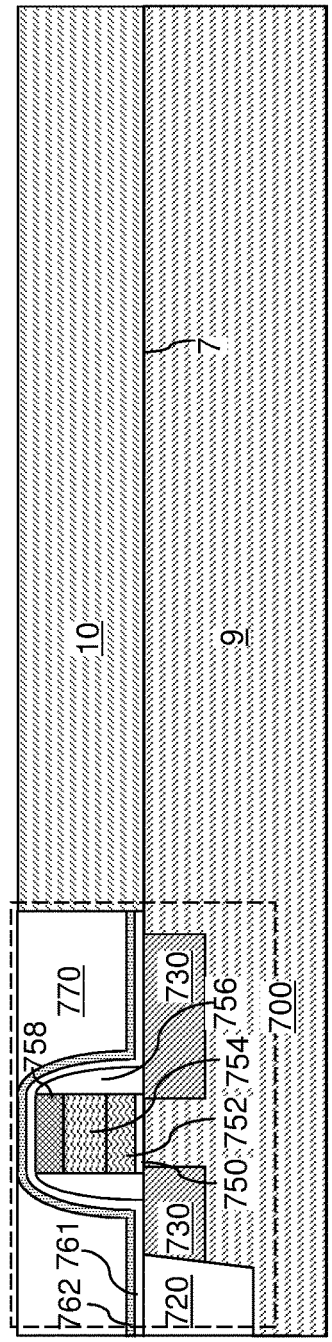
FIG. 1 is a schematic vertical cross-sectional view of an exemplary structure after formation of at least one peripheral device, a semiconductor material layer, and a gate dielectric layer according to an embodiment of the present disclosure.

As discussed above, various embodiments of the present disclosure are directed to three-dimensional memory devices including different height memory stack structures and methods of manufacturing the same, the various aspects of which are described below. Various embodiments include vertically offsetting a first subset of electrically conductive layers from a second subset of electrically conductive layers present within the alternating stack by forming a first region in which all layers of the alternating stack are present and a second region in which at least a topmost one of the electrically conductive layers is absent. By implementing various embodiments, manufacturing methods are simplified as all strings can be reached for metal replacement during fabrication steps, thereby avoiding extra processing steps, reducing manufacturing costs and reducing mis-landing issues. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices of various embodiments of the present disclosure include a monolithic three-dimensional NAND string memory device, and can be fabricated using the various embodiment methods described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
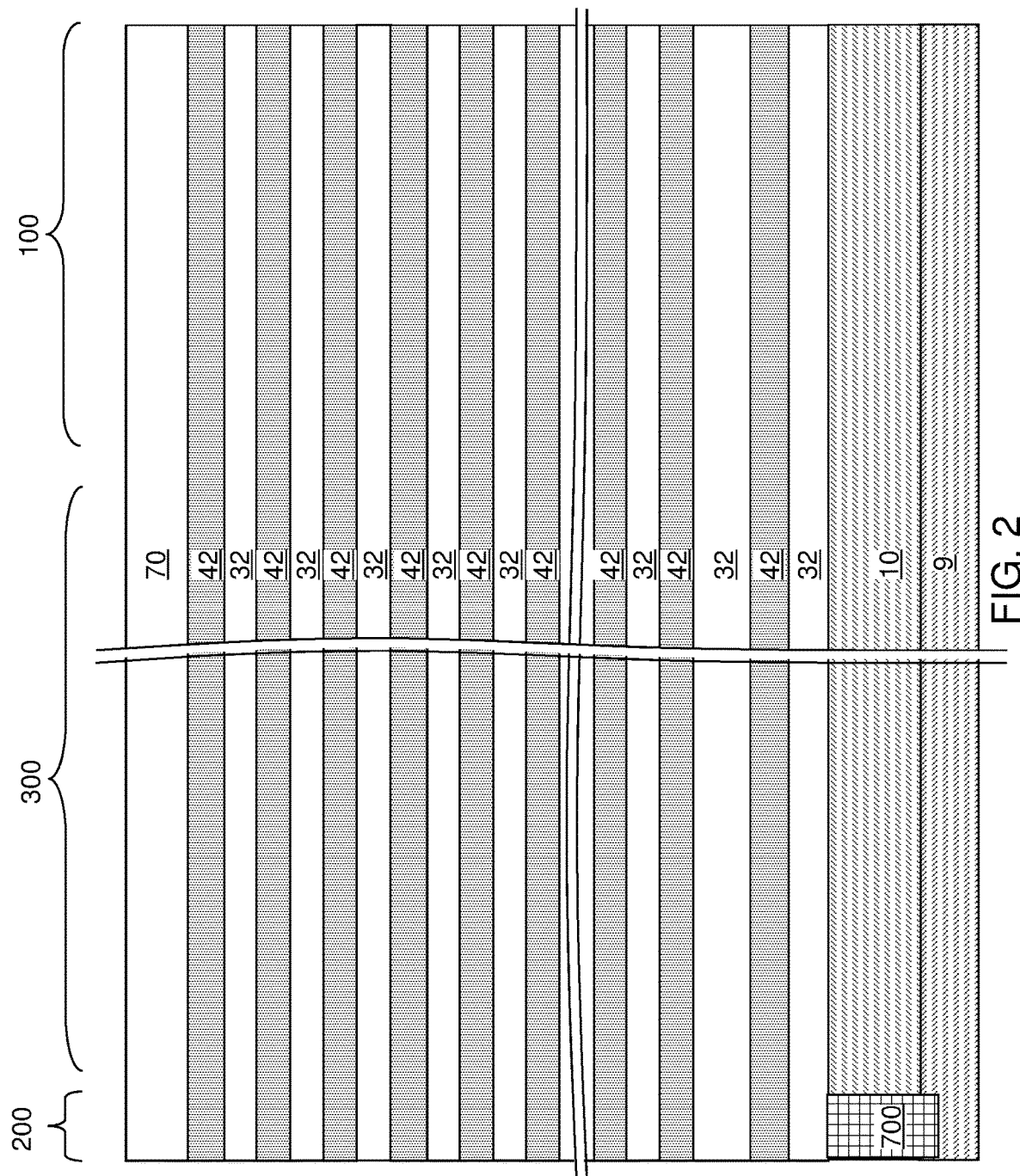
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have the same thickness as each of the insulating layers 32. The insulating cap layer 70 can be deposited, for example, by chemical vapor deposition. In one embodiment, the insulating cap layer 70 can be a silicon oxide layer.

Figure 3A:
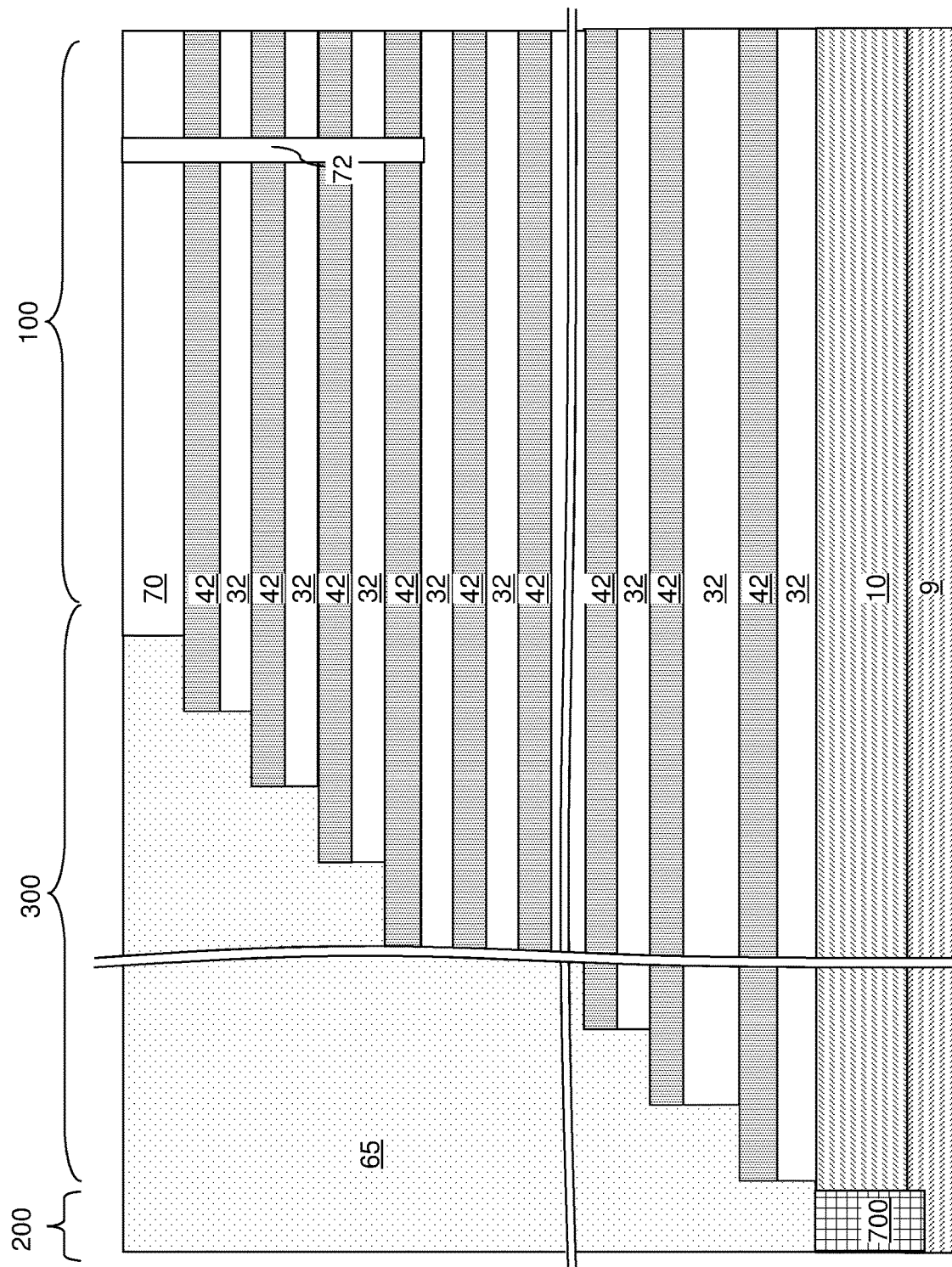
FIG. 3A is a schematic vertical cross-sectional view of the exemplary structure after formation of stepped terraces and a retro-stepped dielectric material portion according to an embodiment of the present disclosure.
Figure 3B:
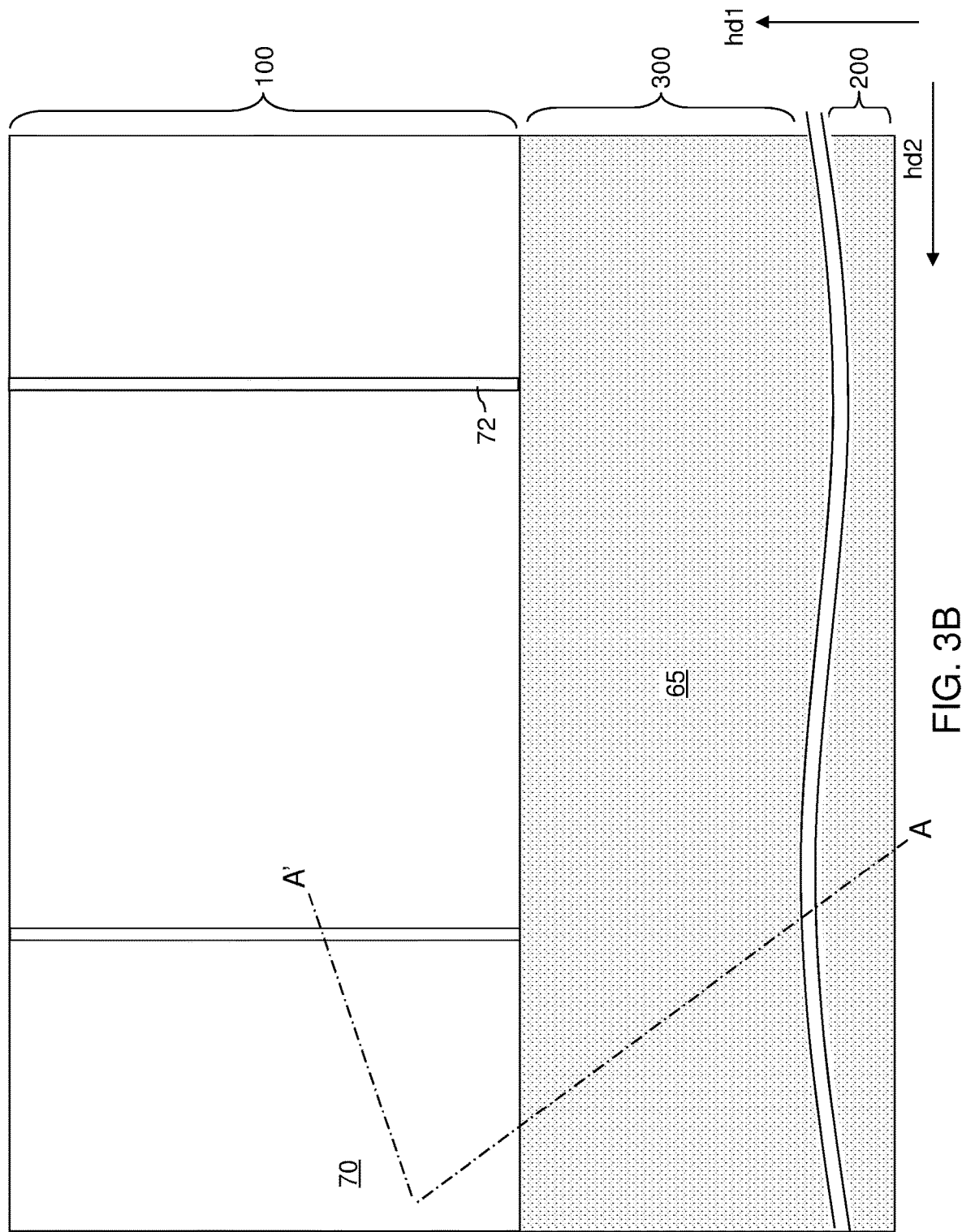
FIG. 3B is a top-down view of the exemplary structure of FIG. 3A. The hinged vertical plane A-A' is the plane of the cross-section for FIG. 3A.

Referring to FIGS. 3A and 3B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Dielectric isolation structures 72 can be formed through the insulating cap layer 70 and a subset of the sacrificial material layers 42 located at drain select levels that are located in an upper portion of the alternating stack (32, 42). The dielectric isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70. The dielectric isolation structures 72 can laterally extend along a first horizontal direction hd1, and can have a uniform width along a second horizontal direction hd2 that is perpendicular to the first horizontal direction hd1.

Figure 4A:
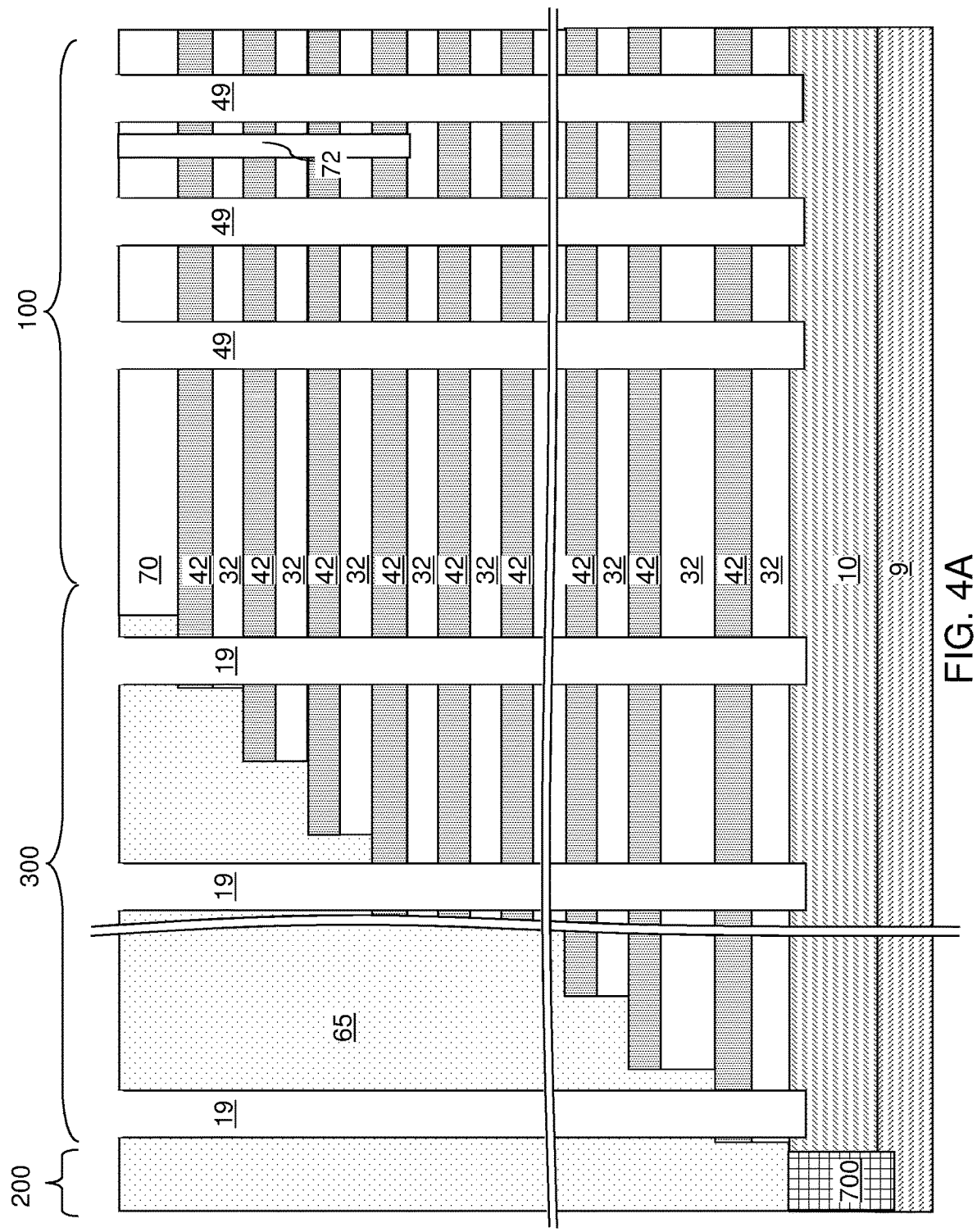
FIG. 4A is a schematic vertical cross-sectional view of the exemplary structure after formation of memory openings and support openings according to an embodiment of the present disclosure.
Figure 4B:
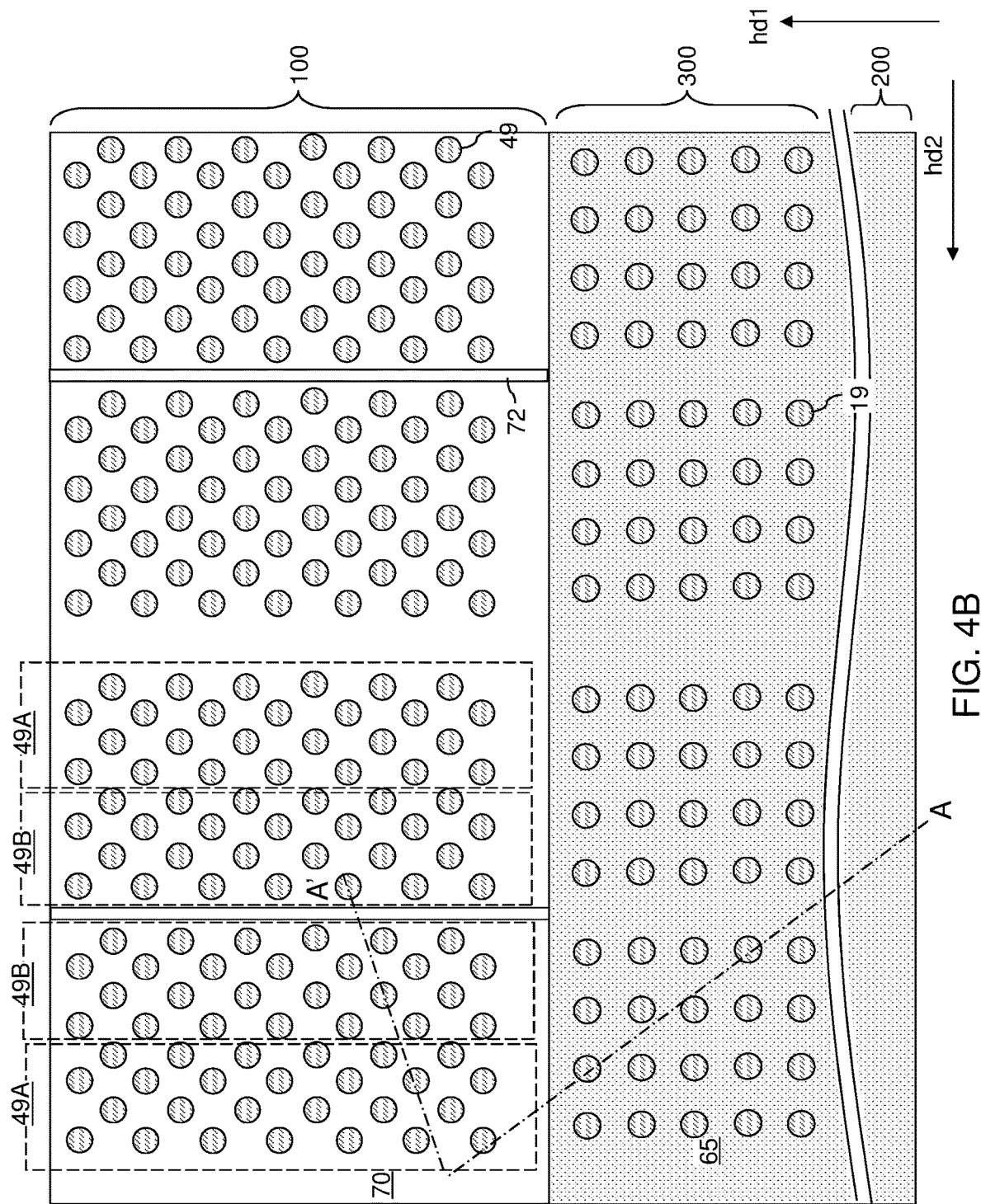
FIG. 4B is a top-down view of the exemplary structure of FIG. 4A. The hinged vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

The memory openings 49 can include groups of first memory openings 49A that are arranged in a first two-dimensional array, and groups of second memory openings 49B that are arranged in a second two-dimensional array. Each group of first memory openings 49A can include multiple rows of memory openings 49 such that each row of memory openings laterally extends along the first horizontal direction hd1 and the multiple rows are laterally spaced apart thereamongst along the second horizontal direction hd2. Each group of second memory openings 49A can include multiple rows of memory openings 49 such that each row of memory openings laterally extends along the first horizontal direction hd1 and the multiple rows are laterally spaced apart thereamongst along the second horizontal direction hd2. A group of first memory openings 49A and a group of second memory openings 49B can be adjacent to each other, and can be laterally spaced apart along the second horizontal direction hd2. In one embodiment, the group of second memory openings 49B can be adjacent to a dielectric isolation structure 72, and the group of first memory openings 49A can be laterally spaced apart from the dielectric isolation structure 72 by the group of second memory openings 49B. In one embodiment, the first two-dimensional array of a group of first memory openings 49A and the second two-dimensional array of a group of second memory openings 49B can have a same two-dimensional periodicity and can be on-pitch with respect to each other. As used herein, two adjacent two-dimensional arrays of on-pitch with respect to each other if the union of the two adjacent two-dimensional arrays constitutes a single periodic two-dimensional array.

Figure 5:
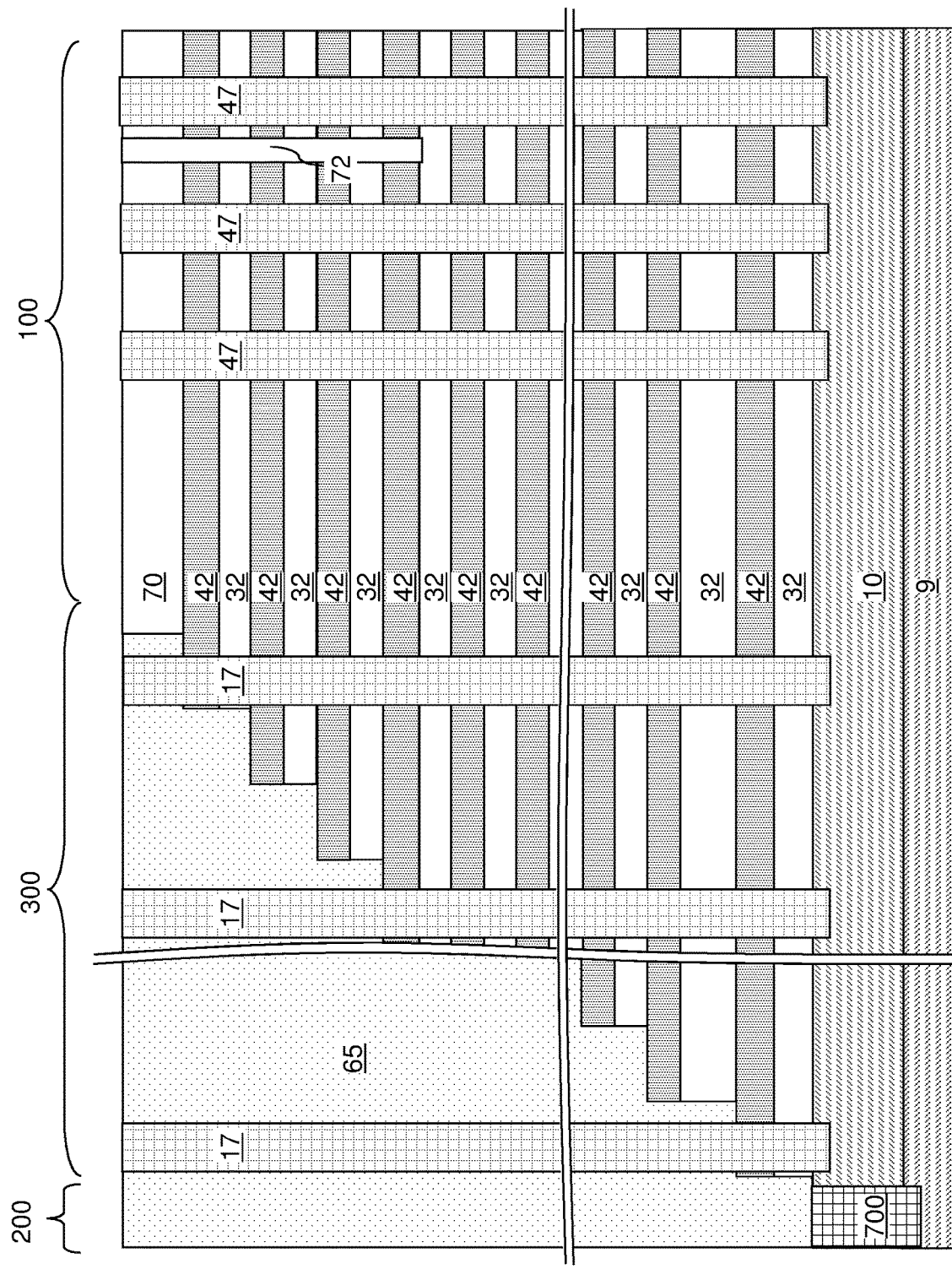
FIG. 5 is a schematic vertical cross-sectional view of the exemplary structure after formation of sacrificial memory opening fill structures and sacrificial support opening fill structures according to an embodiment of the present disclosure.

Referring to FIG. 5, a sacrificial fill material is concurrently deposited in each of the memory openings 49 and the support openings 19. The sacrificial fill material can include a material that can be subsequently removed selective to the materials of the alternating stack (32, 42), the insulating cap layer 70, the retro-stepped dielectric material portion 65, and the semiconductor material layer 10. Optionally, a sacrificial liner (not illustrated) may be formed at a periphery and a bottom surface of each of the memory openings 49 and the supper openings 19 to facilitate subsequent removal of the sacrificial material while minimizing collateral etching of the materials of the alternating stack (32, 42), the insulating cap layer 70, the retro-stepped dielectric material portion 65, and the semiconductor material layer 10.

In one embodiment, the sacrificial fill material can include a semiconductor material such as silicon (e.g., a-Si or polysilicon), a silicon-germanium alloy, germanium, a III-V compound semiconductor material, or a combination thereof. The sacrificial fill material may be formed by a non-conformal deposition or a conformal deposition method.

In another embodiment, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the alternating stack (32, 42).

Excess portions of the sacrificial fill material can be removed from above the top surface of the insulating cap layer 70 by a planarization process, which can include a recess etch process and/or a chemical mechanical planarization process. Each remaining portion of the sacrificial fill material in the memory openings 49 constitutes a sacrificial memory opening fill structure 47. Each remaining portion of the sacrificial fill material in the support openings 19 constitutes a sacrificial support opening fill structure 17.

Figure 6A:
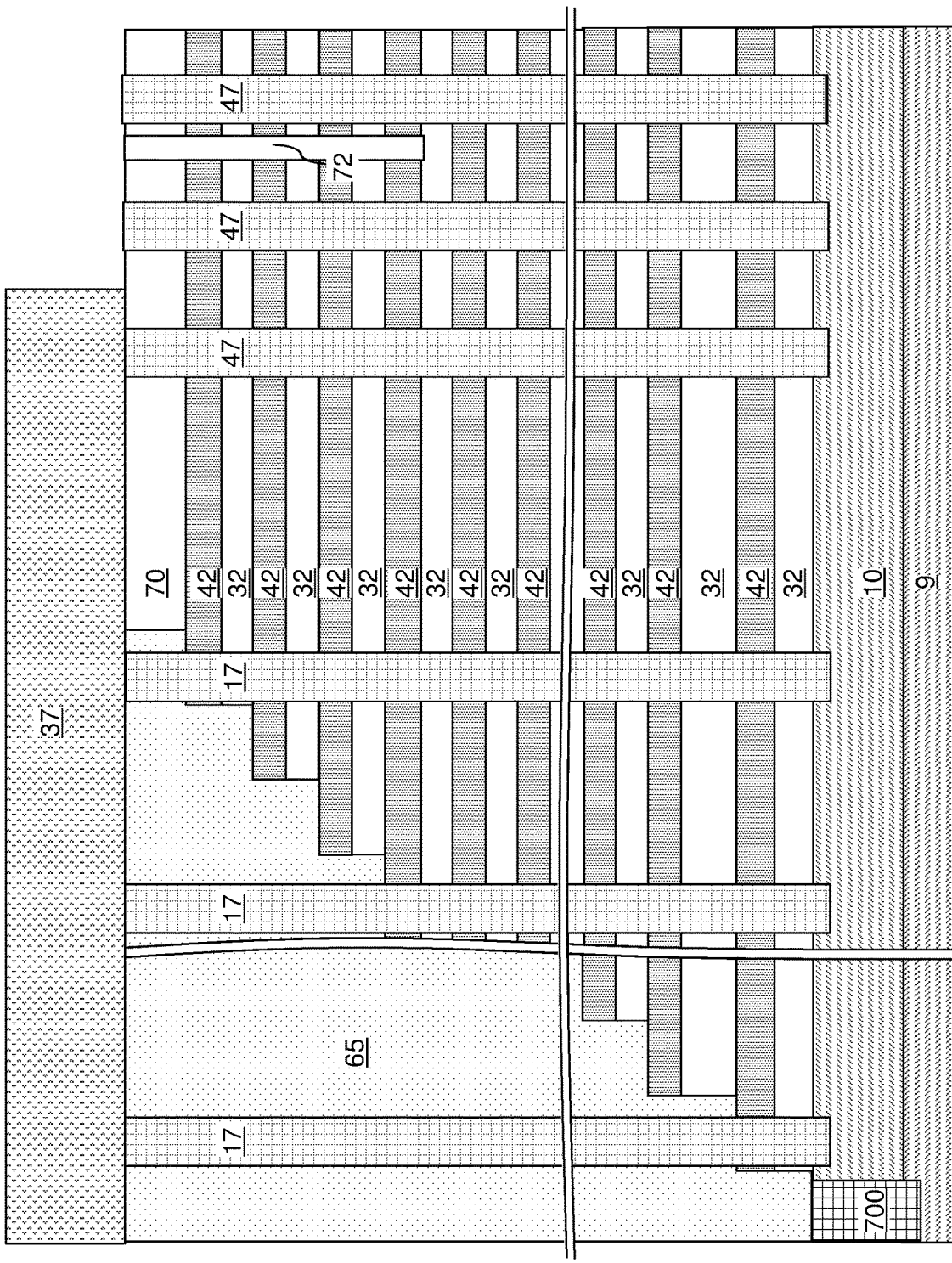
FIG. 6A is a schematic vertical cross-sectional view of the exemplary structure after masking a first subset of the sacrificial memory opening fill structures and the sacrificial support opening fill structures with a patterned photoresist layer according to an embodiment of the present disclosure.
Figure 6B:
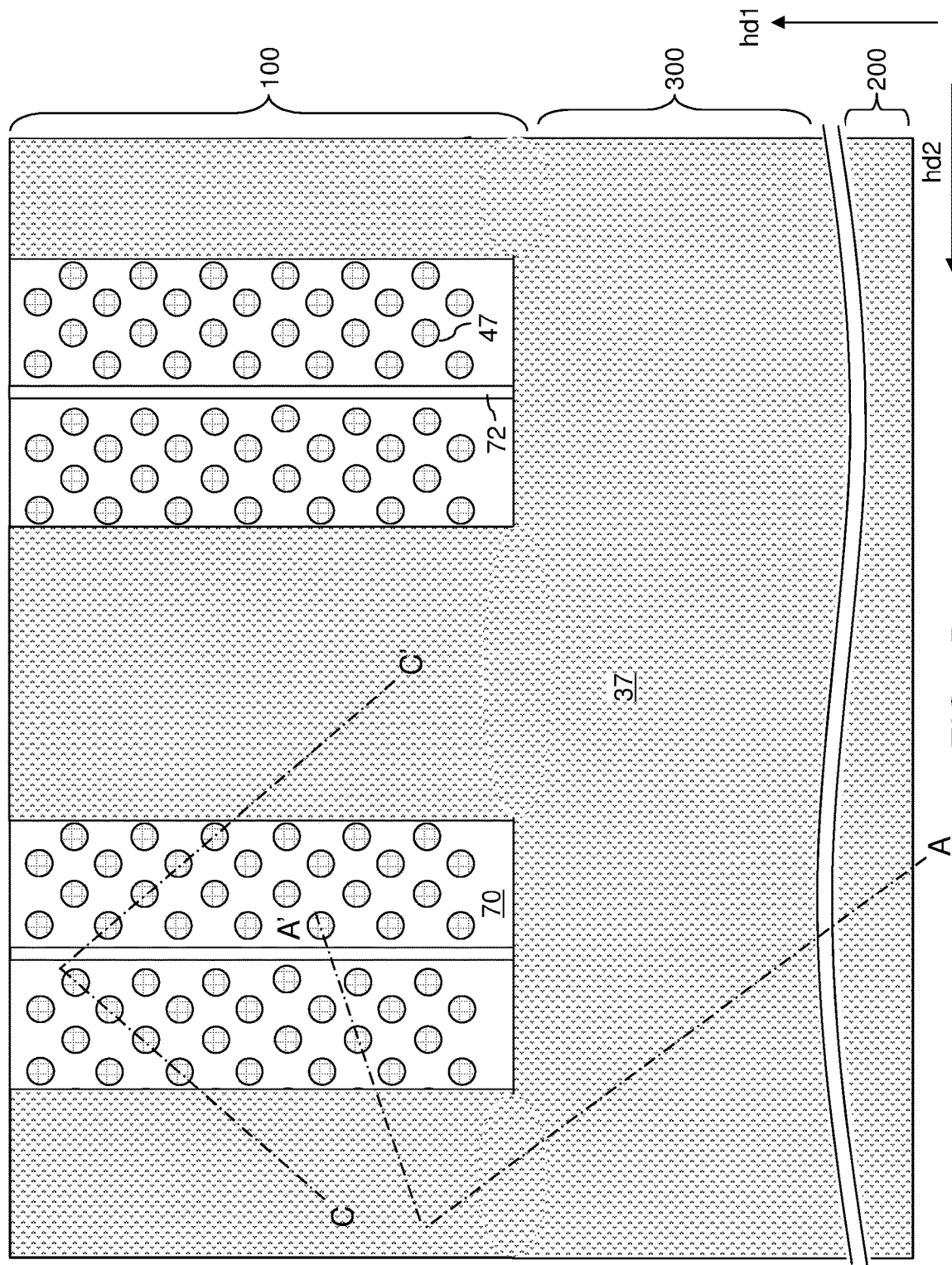
FIG. 6B is a top-down view of the exemplary structure of FIG. 6A. The hinged vertical plane A-A' is the plane of the cross-section for FIG. 6A.
Figure 6C:
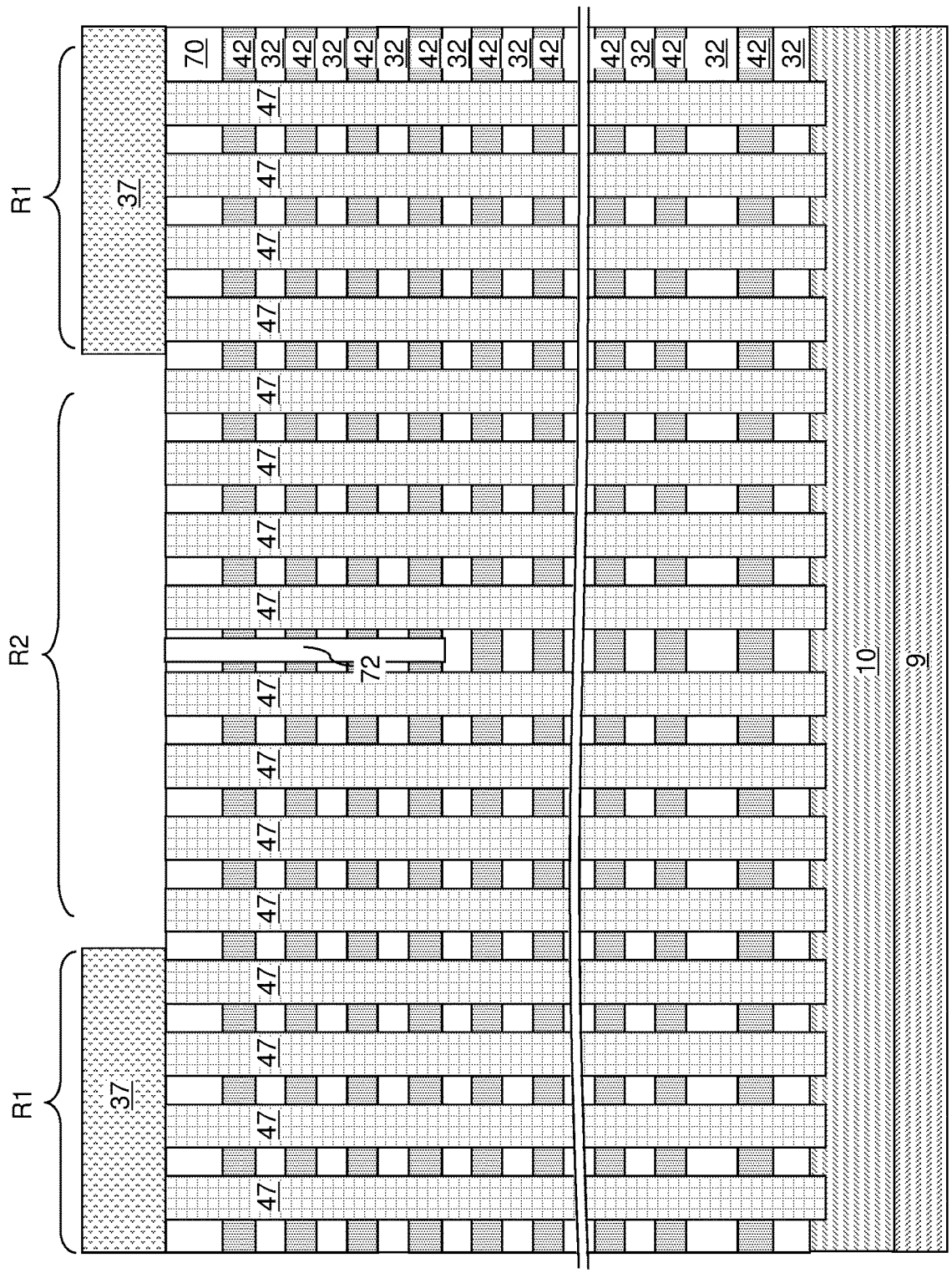
FIG. 6C is a schematic vertical cross-sectional view of the exemplary structure along the hinged vertical plane C-C' of FIG. 6B.

Referring to FIGS. 6A-6C, a photoresist layer 37 can be applied over the insulating cap layer 70 and the retro-stepped dielectric material portion 65, and can be lithographically patterned to cover the retro-stepped dielectric material portions 65 and a first region R1 of the alternating stack (32, 42), while not covering a second region R2 of the alternating stack (32, 42). The first region R1 of the alternating stack (32, 42) can include the areas of the groups of the first memory openings 49A. The second region R2 of the alternating stack (32, 42) can include the areas of the second memory openings 49B. First groups of sacrificial memory opening fill structures 47 located within the groups of first memory openings 49A and the sacrificial support opening fill structures 17 are in the first region, and are masked by the patterned photoresist layer 37. Second groups of sacrificial memory opening fill structures 47 located within the groups of the second memory openings 49B are in the second region, and are not masked by the patterned photoresist layer 37. Each first group of sacrificial memory opening fill structures 47 can be spaced from a most proximate one of the dielectric isolation structures by a respective second group of sacrificial memory opening fill structures 47. The dielectric isolation structures 72 can be located within a respective opening in the photoresist layer 37.

Figure 7A:
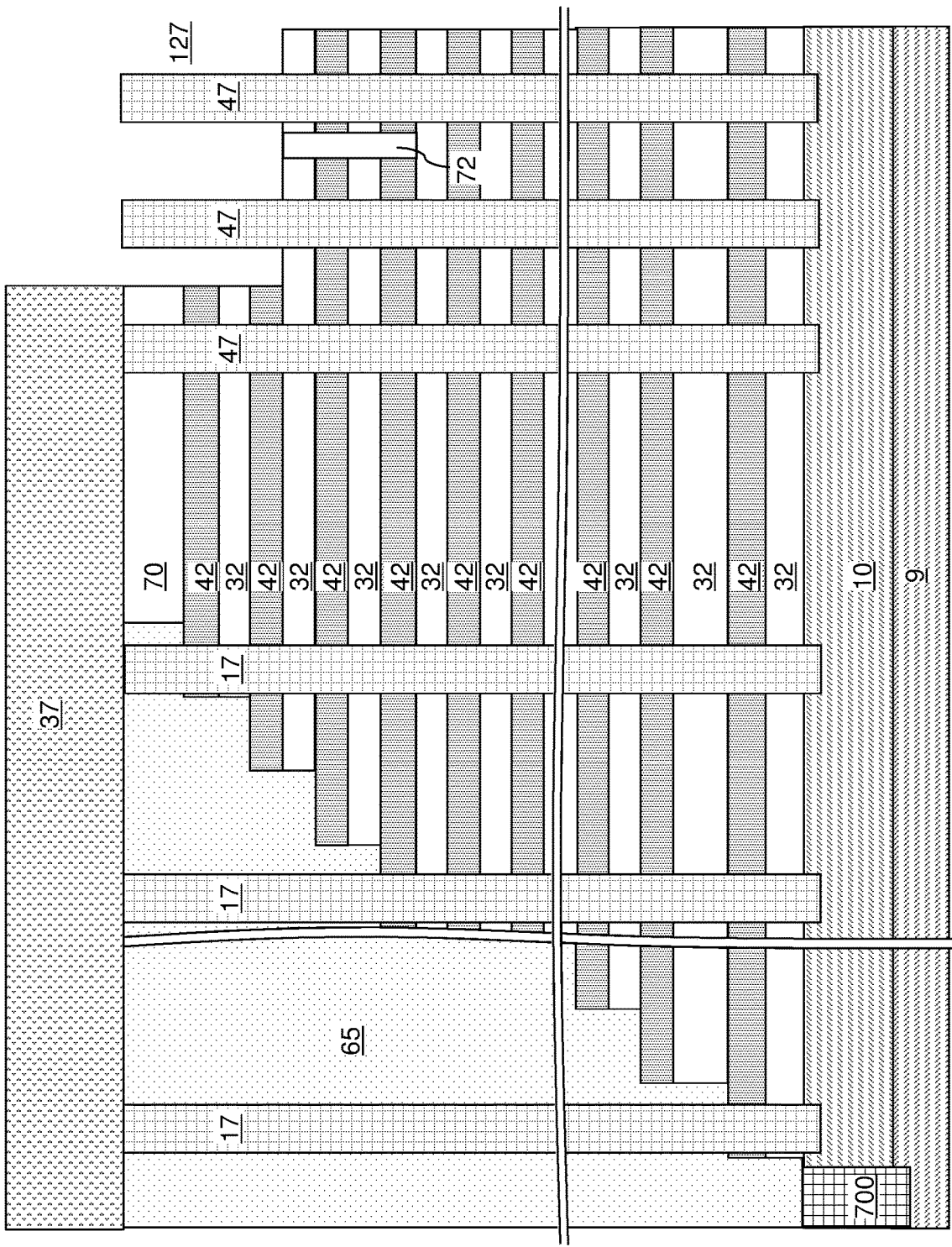
FIG. 7A is a schematic vertical cross-sectional view of the exemplary structure after recessing unmasked portions of the alternating stack according to an embodiment of the present disclosure.
Figure 7B:
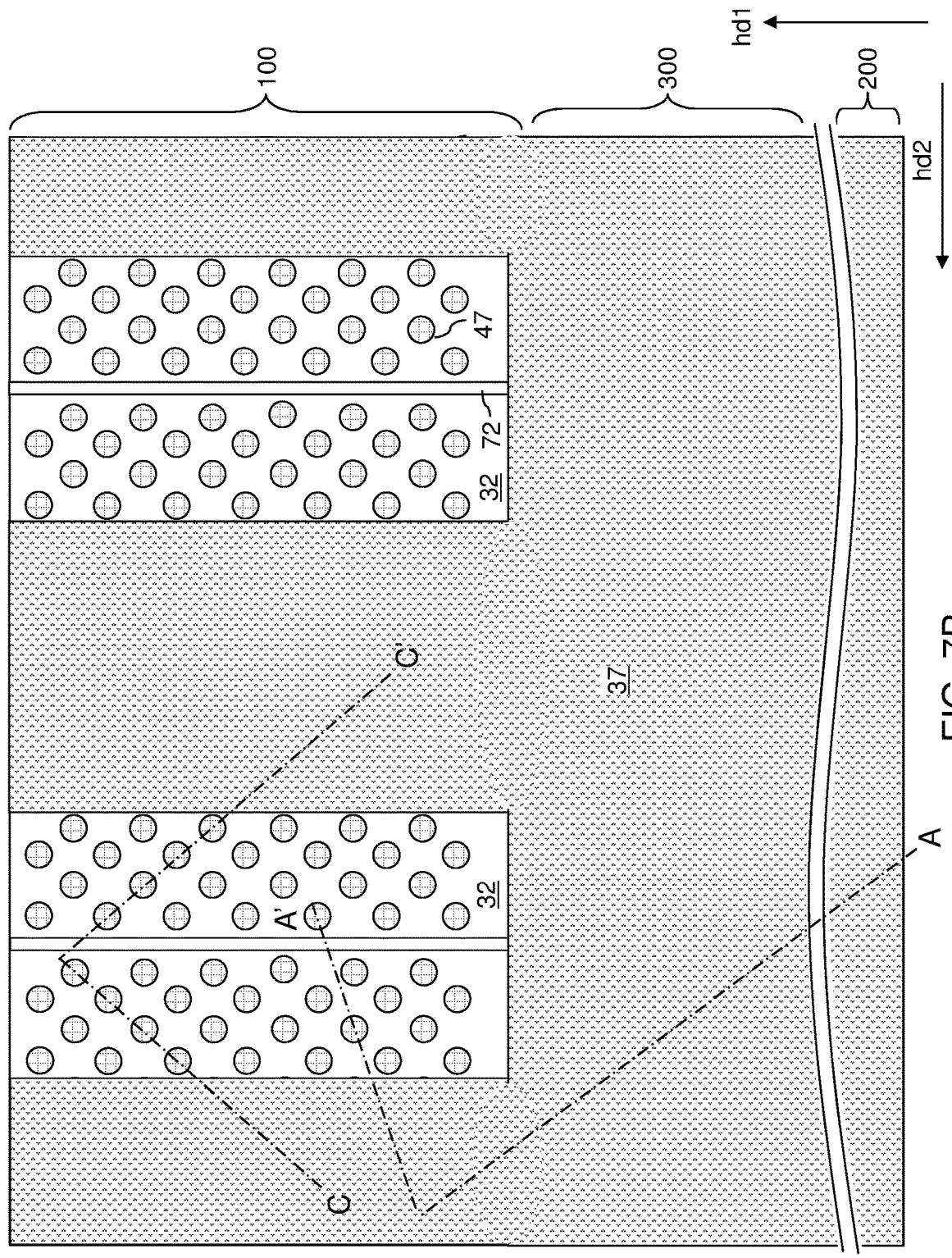
FIG. 7B is a top-down view of the exemplary structure of FIG. 7A. The hinged vertical plane A-A' is the plane of the cross-section for FIG. 7A.
Figure 7C:
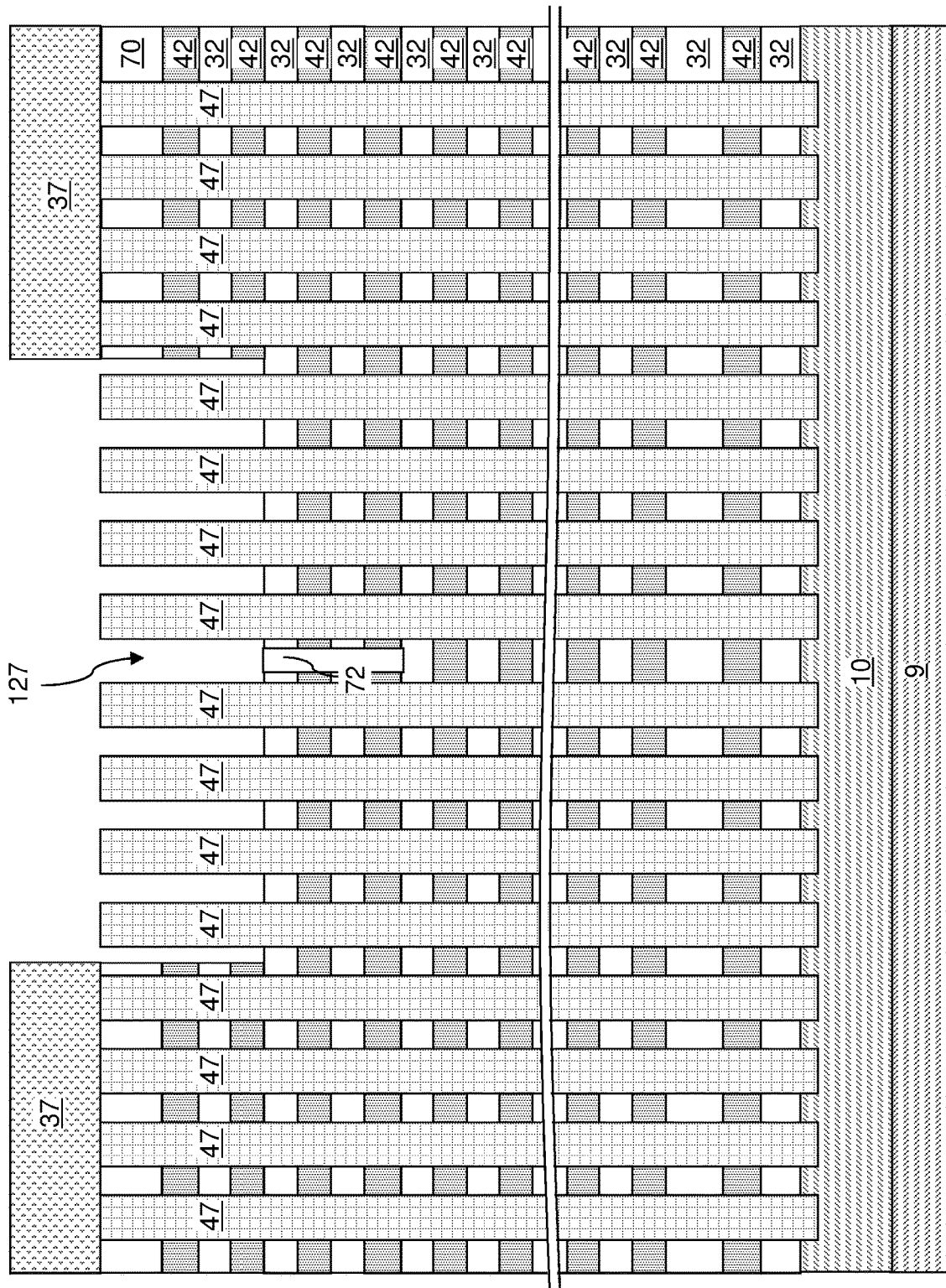
FIG. 7C is a schematic vertical cross-sectional view of the exemplary structure along the hinged vertical plane C-C' of FIG. 7B.

Referring to FIGS. 7A-7C, recess regions are formed within the alternating stack (32, 42) in the area of the second region by recessing the portions of the insulating cap layer 70 and the alternating stack (32, 42) that are not masked by the photoresist layer 37. An anisotropic etch process can be performed to etch unmasked portions of the insulating cap layer 70 and at least one underlying sacrificial material layer 42. The anisotropic etch process etches any intervening insulating layer 32 in case the at least one underlying sacrificial material layer 42 includes a plurality of sacrificial material layers 42. Upper portions of the dielectric isolation structures 72 can be etched concurrent with etching of the insulating cap layer, the at least one underlying sacrificial material layer 42, and any intervening insulating layers 32. Upper portions of physically exposed sacrificial memory opening fill structures 47 may be collaterally etched.

The anisotropic etch process can include multiple steps having different etch chemistries to sequentially etch the materials of the insulating cap layer 70, the topmost sacrificial material layer 42, and any underlying material layers down to the bottommost layer among the at least one underlying sacrificial material layer 42. An insulating layer 32 underlying the bottommost layer among the at least one underlying sacrificial material layer 42 can function as an etch stop layer.

In an illustrative example, the drain select levels can include four topmost sacrificial material layers 42, the dielectric isolation structures 72 can extend through the four topmost sacrificial material layers 42, and the anisotropic etch process can etch through the insulating cap layer 70, two topmost sacrificial material layers 42 (i.e., the two upper sacrificial material layers among the four topmost sacrificial material layers 42), and a topmost insulating layer 32 located between the topmost sacrificial material layer 42 and a second-from-the-top sacrificial material layer 42. The second-from-the-top insulating layer 32 can be used as an etch stop layer for the last etch step that etches through the second-from-the-top sacrificial material layer 42.

An upper portion of each dielectric isolation structure 72 can be removed concurrently with recessing of the second region of the alternating stack (32, 42). Each remaining portion of the dielectric isolation structures 72 can have a top surface at, or about, a horizontal plane including a top surface of the second-from-the-top insulating layer 32. In one embodiment, each dielectric isolation structure 72 can be located between two neighboring subsets of sacrificial memory opening fill structures 47. In this embodiment, a first subset of the sacrificial memory opening fill structures 47 can be located on one side of a remaining portion of the dielectric isolation structure 72 and a second subset of the sacrificial memory opening fill structures 47 can be located on another side of the remaining portion of the dielectric isolation structure 72. A recess region 127 is formed in each volume from which portions of the insulating cap layer 70 and upper layer(s) of the alternating stack (32, 42) are removed within openings in the photoresist layer 37.

Figure 8A:
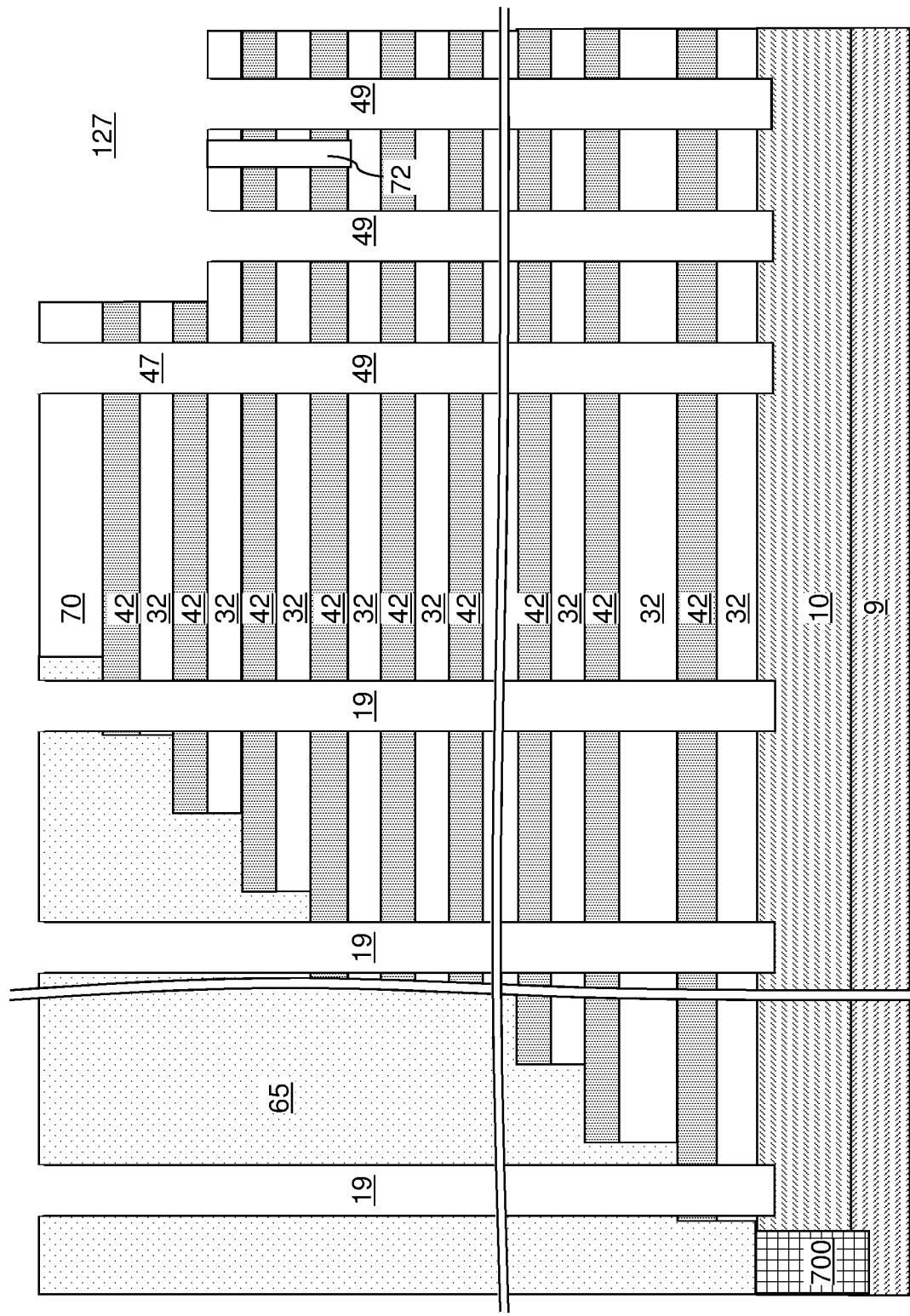
FIG. 8A is a schematic vertical cross-sectional view of the exemplary structure after removing the sacrificial memory opening fill structures and the sacrificial support opening fill structures according to an embodiment of the present disclosure.
Figure 8B:
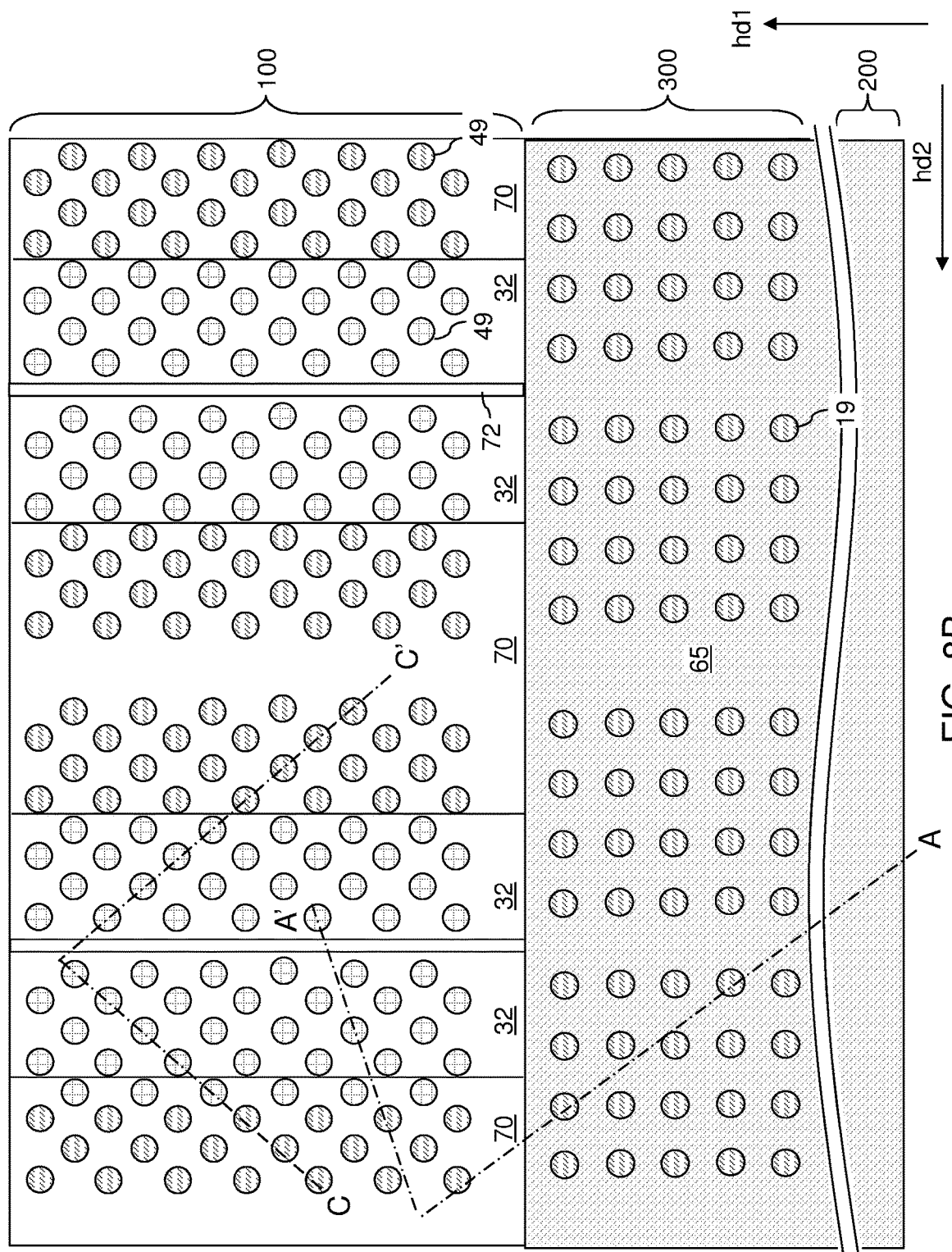
FIG. 8B is a top-down view of the exemplary structure of FIG. 8A. The hinged vertical plane A-A' is the plane of the cross-section for FIG. 8A.
Figure 8C:
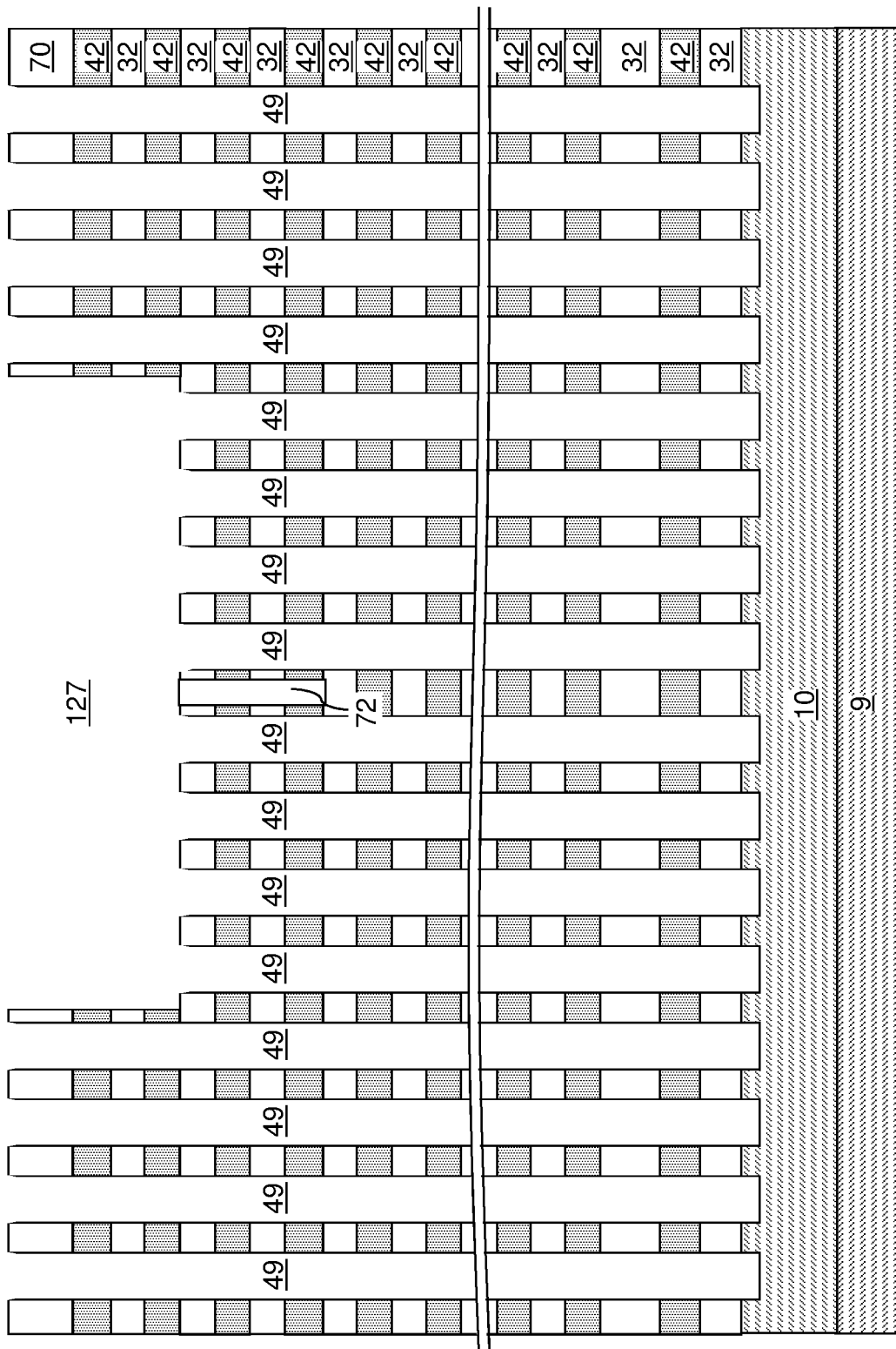
FIG. 8C is a schematic vertical cross-sectional view of the exemplary structure along the hinged vertical plane C-C' of FIG. 8B.

Referring to FIGS. 8A-8C, the photoresist layer 37, the sacrificial memory opening fill structures 47, and the sacrificial support opening fill structures 17 can be removed. The sacrificial memory opening fill structures 47 and the sacrificial support opening fill structures 17 can be removed by an isotropic etch process or an anisotropic etch process that etches the material of the sacrificial memory opening fill structures 47 and the sacrificial support opening fill structures 17 selective to the material of a sacrificial liner (not illustrated) located at a bottom and a periphery of each memory opening 49 and each support opening 19, or selective to the materials of the alternating stack (32, 42) and the semiconductor material layer 10. The photoresist layer 37 can be removed, for example, by ashing.

In an illustrative example, if the sacrificial memory opening fill structures 47 and the sacrificial support opening fill structures 17 include amorphous silicon or a silicon-germanium alloy, a wet etch process using hot trimethyl-2 hydroxyethyl ammonium hydroxide ("hot TMY") or tetramethyl ammonium hydroxide (TMAH) can be used to etch the sacrificial memory opening fill structures 47 and the sacrificial support opening fill structures 17. If the sacrificial memory opening fill structures 47 and the sacrificial support opening fill structures 17 include organosilicate glass or borosilicate glass, a wet etch process using dilute hydrofluoric acid can be used to etch the sacrificial memory opening fill structures 47 and the sacrificial support opening fill structures 17.

The volumes of the memory openings 49 and the volumes of the support openings 19 become empty upon removal of the sacrificial memory opening fill structures 47 and the sacrificial support opening fill structures 17. Sidewalls of the alternating stack (32, 42) and a surface of the semiconductor material layer 10 are physically exposed around each memory opening 49 and around each support opening 19. The memory openings 49 include a first group of memory opening 49 that extend through each layer within the alternating stack (32, 42), and a second group of memory openings 49 that extend through only a subset of layers within the alternating stack (32, 42) and do not extend through a topmost spacer material layer (such as topmost sacrificial material layer 42) within the alternating stack (32, 42). Each memory opening 49 within the second group of memory openings 49 underlies a respective recess region 127.

FIGS. 9A-9H illustrate structural changes in a memory opening 49 within the first group of memory openings 49 during formation of a memory opening fill structure therein. The same structural change occurs simultaneously in each of the other memory openings 49 among the first group of memory openings 49. The same structural changes occur simultaneously in each of the support openings 19 with the modification that the insulating cap layer 70 and/or at least one layer within the alternating stack (32, 42) is replaced with a portion of the retro-stepped dielectric material portion 65. The same structural changes occur simultaneously in each of the memory openings 49 within the second group of memory openings 49 with the modification that the insulating cap layer 70 and material layers corresponding to the level of the recess regions 127 are not present.

Referring to FIG. 9A, a memory opening 49 within the first group of memory openings 49 in the exemplary device structure of FIGS. 8A-8C is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 9B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 9D:
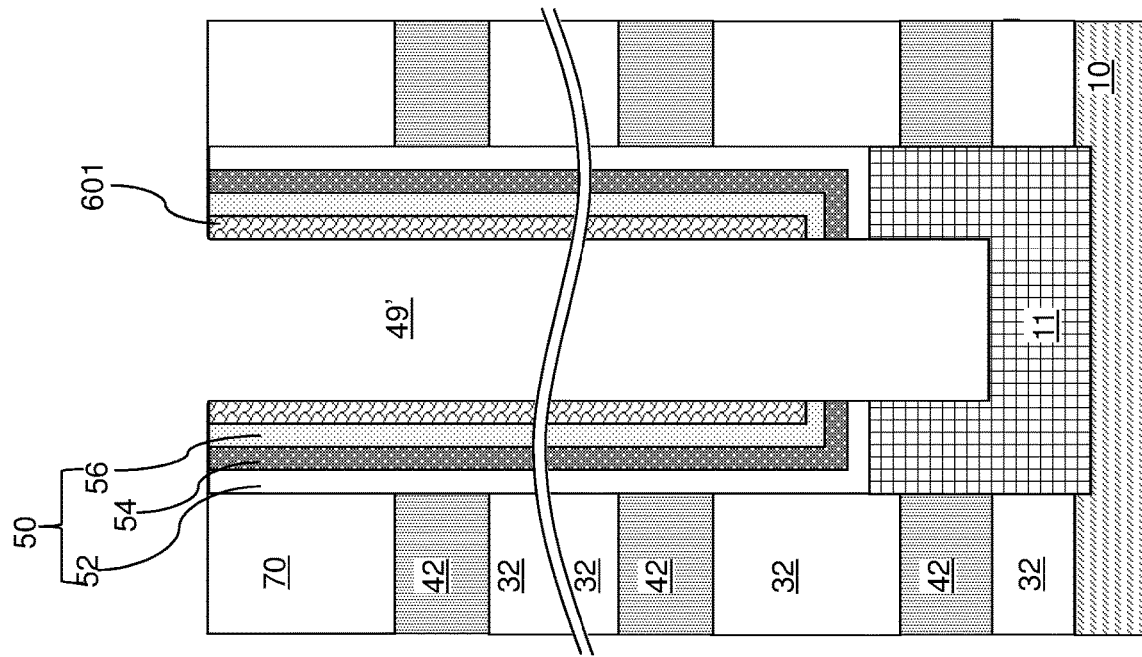
Figure 9C:
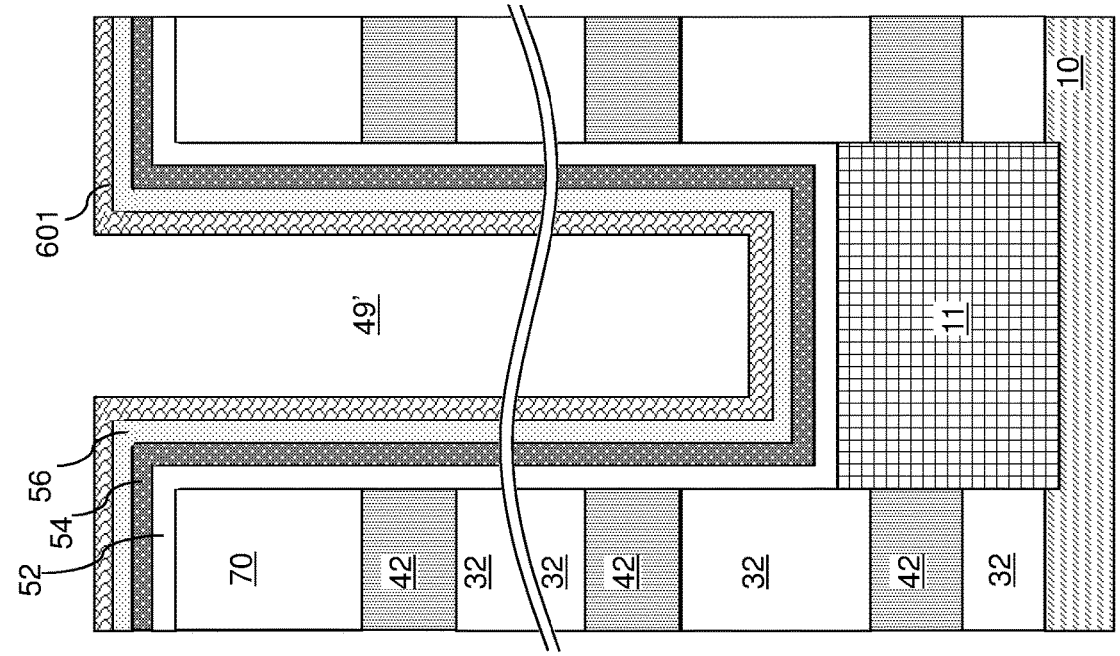

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 or the top surface of a topmost insulating layer 32 underlying a recess region 127 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance.

A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56.

In one embodiment, the first semiconductor channel layer 601, the tunneling dielectric layer 56, the charge storage layer 54, and the blocking dielectric layer 52 can have vertically coincident sidewalls.

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art.

In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9H:
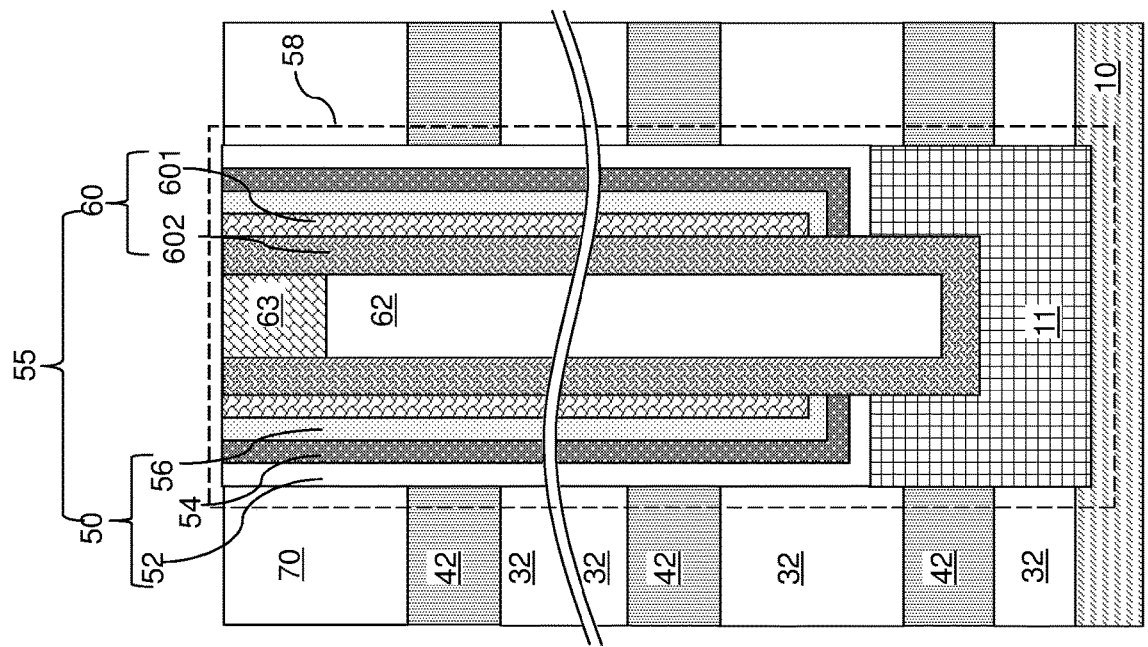
Figure 9G:
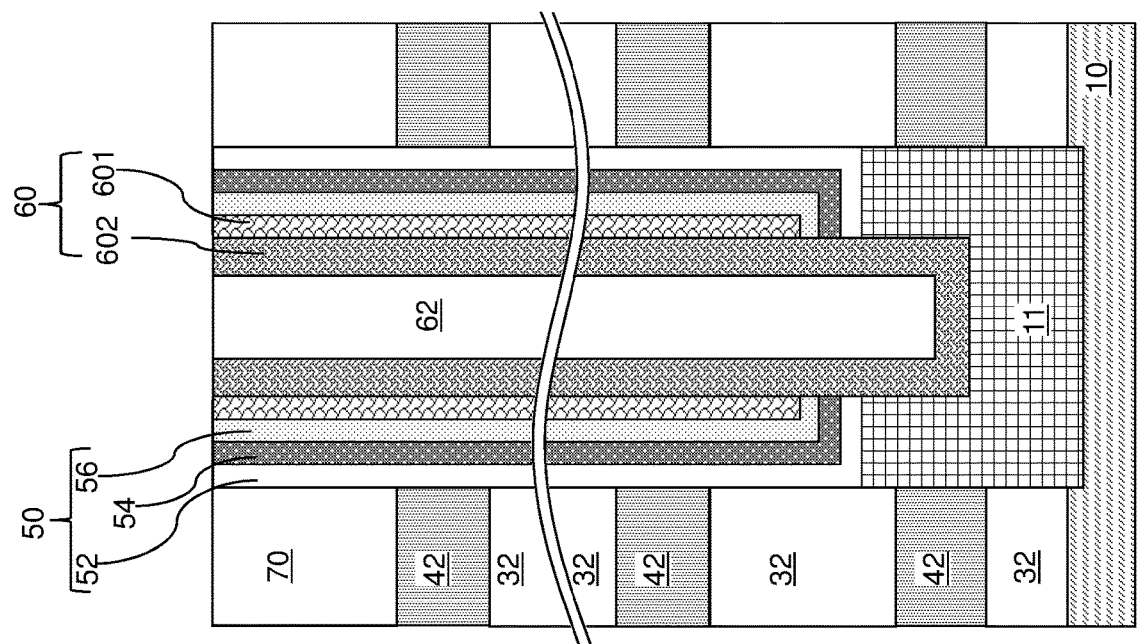

Referring to FIG. 9G, the horizontal portion of the dielectric core layer 62L can be removed, for example, by a recess etch from above the top surface of the insulating cap layer 70 or a topmost insulating layer underlying a recess region 127. Each remaining portion of the dielectric core layer 62L constitutes a dielectric core 62. Further, the horizontal portion of the second semiconductor channel layer 602 located above the top surface of the insulating cap layer 70 or the topmost insulating layer 32 underlying a recess region 127 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is less than the thickness of the insulating cap layer 70 and less than the thickness of the topmost insulating layer 32 underneath the recess regions 127. Drain regions 63 can be formed by depositing a doped semiconductor material within each recess region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70 and from above a topmost insulating layer 32 underlying a recess region 127, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 10A:
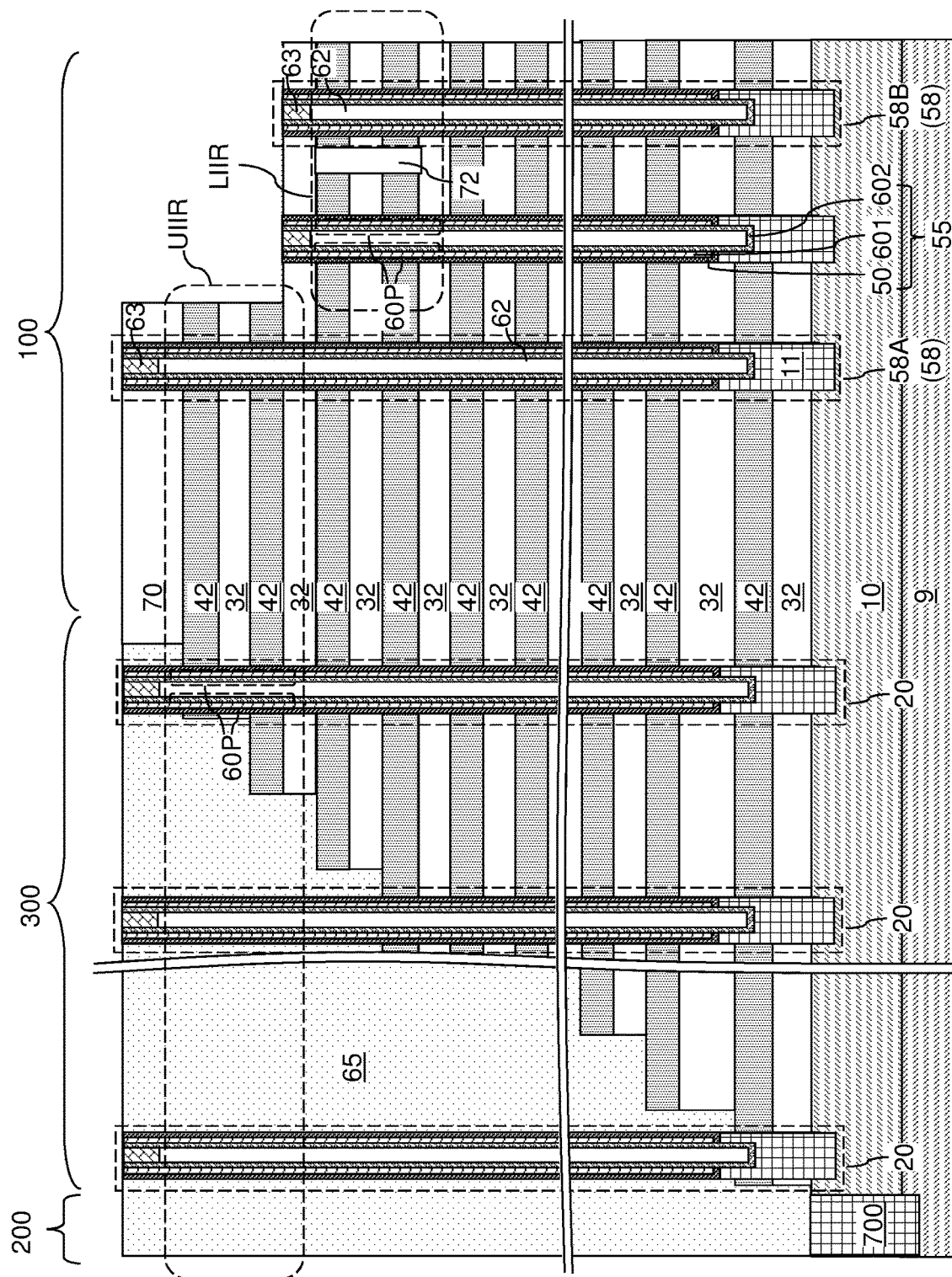
FIGS. 10A and 10B are schematic vertical cross-sectional views of the exemplary structure after dopant implantation into upper portions of vertical semiconductor channels in the memory stack structures according to an embodiment of the present disclosure.
Figure 10B:
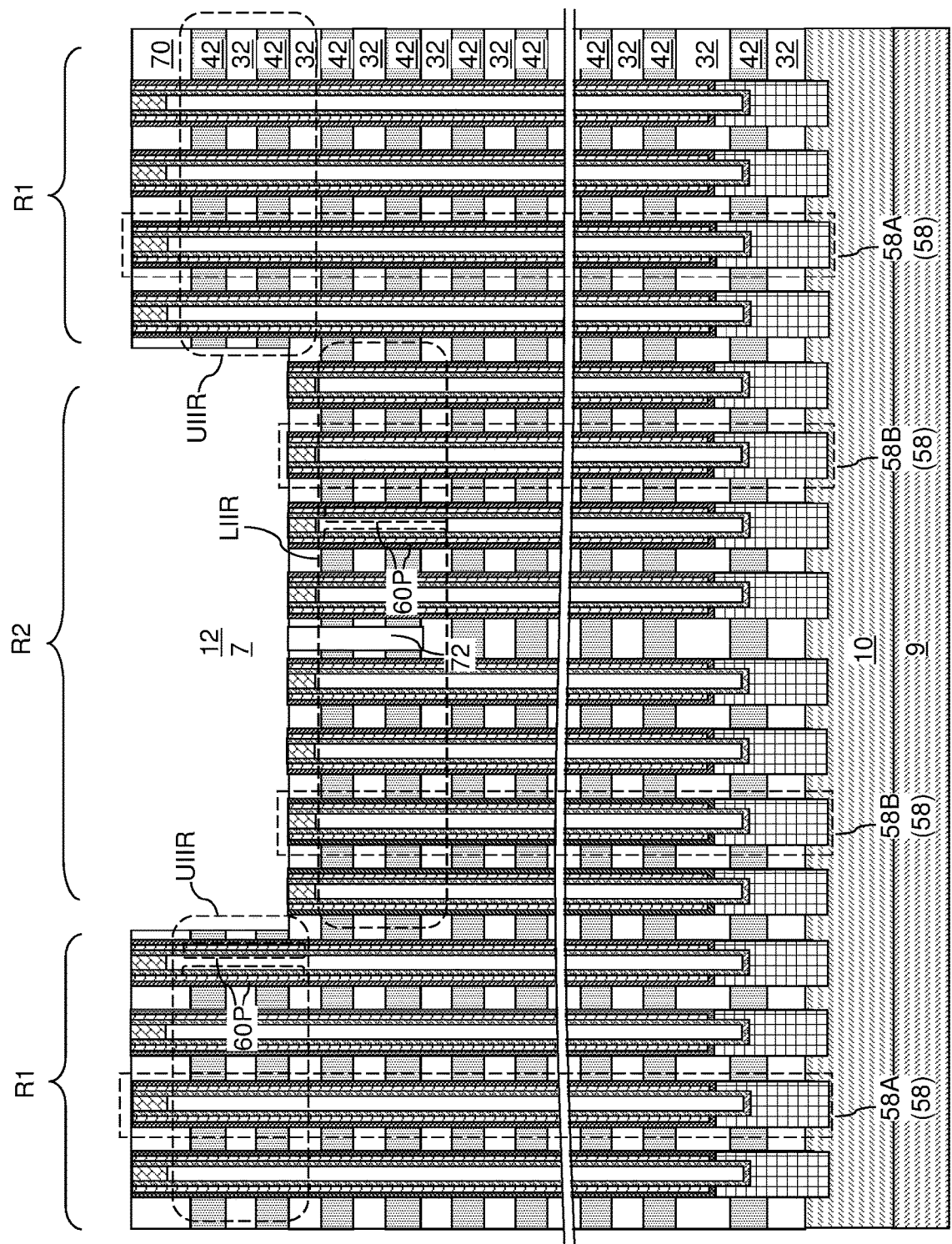

Referring to FIGS. 10A and 10B, the exemplary structure is illustrated after formation of the memory opening fill structures 58. The memory stack structures 58 comprise first memory opening fill structures 58A extending through the first region R1 of the alternating stack (32, 42) and second memory opening fill structures 58B extending through the second region R2 of the alternating stack (32, 42). Each of the first memory opening fill structures 58A and the second memory opening fill structures 58B comprises a respective memory film 50 and a respective vertical semiconductor channel 60 that is laterally surrounded by the respective memory film 50. Top surfaces of the first memory opening fill structures 58A are formed within a horizontal plane including a top surface of the insulating cap layer 70. Top surfaces of the second memory opening fill structures 58B are formed within a horizontal plane including a top surface of an insulating layer 32 located immediately below a recess region 127. The top surfaces of the first memory opening fill structures 58A are located above the horizontal plane including top surfaces of the second memory opening fill structures 58B. A support pillar structure 20 including a same set of components as a first memory opening fill structure 58A can be formed in each support opening 19 concurrently with formation of the memory opening fill structures 58.

Electrical dopants of the first conductivity type can be implanted into upper regions of the vertical semiconductor channels 60. The vertical semiconductor channels 60 have a doping of the first conductivity type as formed. Thus, the implanted electrical dopants have the same conductivity type as the vertical semiconductor channels 60. The energy of the implantation process can be selected such that the electrical dopants are distributed at the level(s) of the sacrificial material layer(s) 42 that overlie the horizontal plane including the top surface of the topmost sacrificial material layer 42 within the second region R2. Upper ion implant regions UIIR are formed within the first region R1 between the horizontal plane including bottom surfaces of drain regions 63 within the first region R1 and the horizontal plane including the bottom surfaces of drain regions 63 within the second region R2. Lower ion implant regions LIIR are formed within the second region R2 underneath each drain region 63 that underlies a recess region 127. The total number of sacrificial material layers 42 over which the lower ion implant regions LIIR vertically extend can be the same as the total number of sacrificial material layers 42 over which the upper ion implant regions UIIR vertically extend. In one embodiment, the lower ion implant regions LIIR and the upper ion implant regions UIIR can vertically extend over a respective set of two sacrificial material layers 42, a respective set of one sacrificial material layer 42, a respective set of three sacrificial material layers 42, or a respective set of four sacrificial material layers 42.

A pocket doping region 60P is formed within each of the vertical semiconductor channels 60. Each pocket doping region 60P is a portion of a vertical semiconductor channel 60 located within an upper ion implant region UIIR in the first region R1 or located within a lower ion implant region LIIR in the second region R2. The pocket doping regions 60P of vertical semiconductor channels 60 of the first memory opening fill structures are formed at least partly above the horizontal plane including a recessed surface of the alternating stack (32, 42) that is formed in the recess region 127, i.e., the bottom surface of the recess region 127. Pocket doping regions 60P of vertical semiconductor channels 60 of the second memory opening fill structures 58B are located entirely below the horizontal plane including the recessed surface. The pocking doping regions function as channel regions of field effect transistors to be subsequently formed by replacing the sacrificial material layers 42 with electrically conductive layers, and increases the threshold voltage for the field effect transistors in which the pocket doping regions 60P function as channel regions.

The vertical dopant concentration profile of each pocket doping region 60P can be the same except for a vertical shift across the first region R1 and the second region R2. Thus, a vertical dopant concentration profile for the pocket doping regions 60P of the vertical semiconductor channels 60 of the second memory opening fill structures 58B matches, and is vertically shifted from, a vertical dopant concentration profile for the pocket doping regions 60P of the vertical semiconductor channels 60 of the first memory opening fill structures 58A. Within each recess region 127, a first subset of second memory opening fill structures 58B can be formed on one side of a dielectric isolation structure 72 and a second subset of the second memory opening fill structures 58B can be formed on another side of the dielectric isolation structure 72.

Figure 11A:
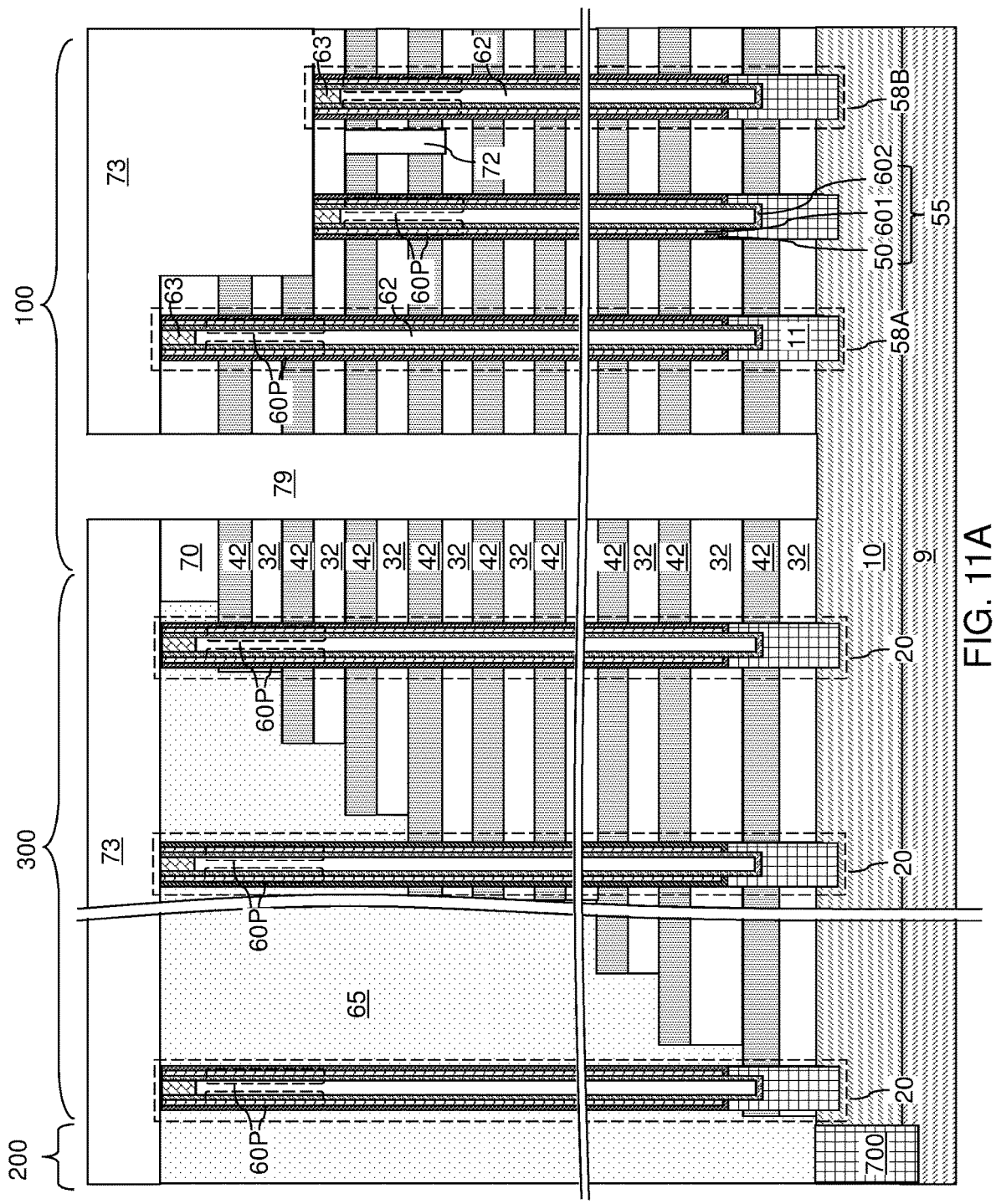
FIG. 11A is a schematic vertical cross-sectional view of the exemplary structure after formation of a dielectric cap material layer and backside trenches according to an embodiment of the present disclosure.
Figure 11B:
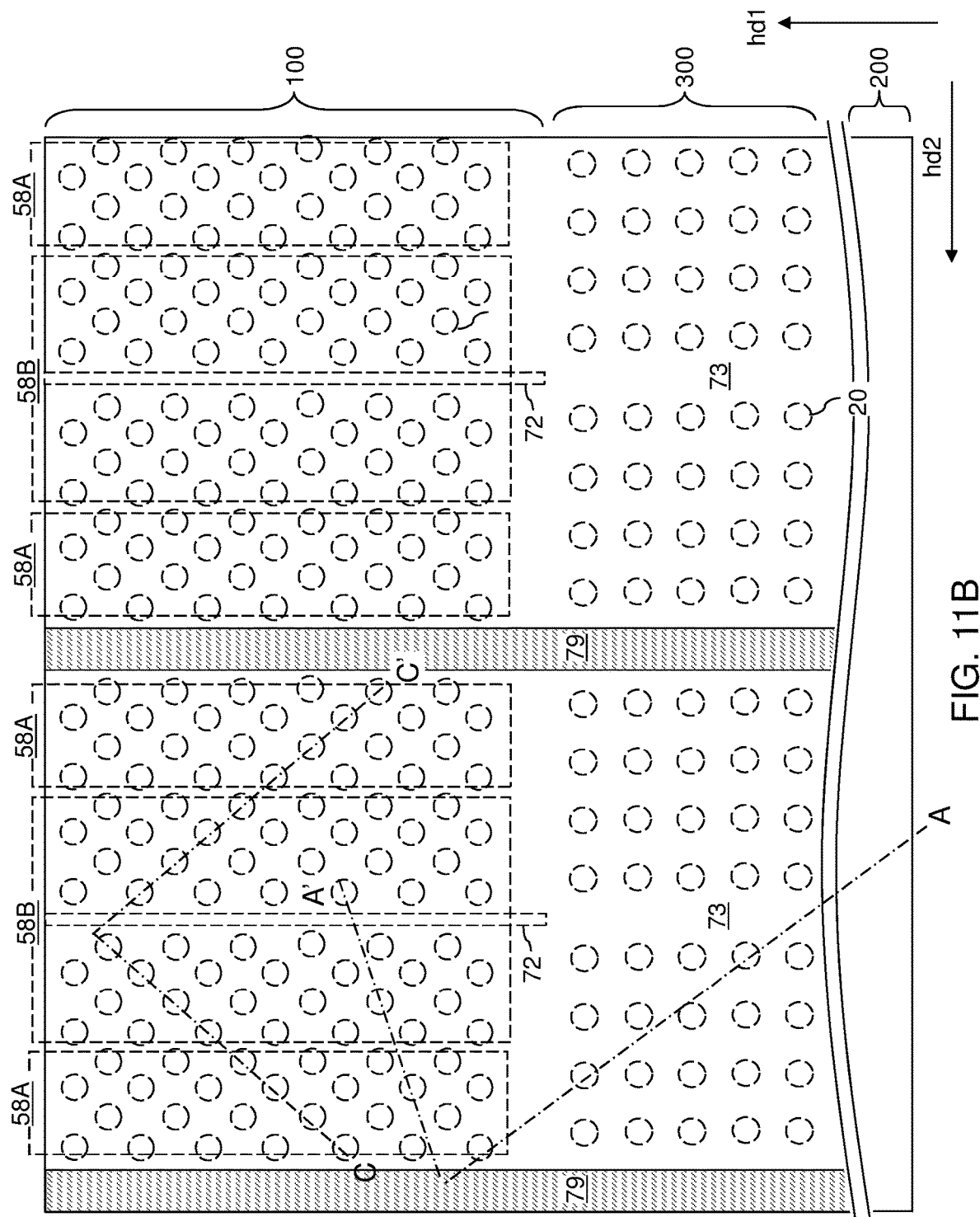
FIG. 11B is a partial see-through top-down view of the exemplary structure of FIG. 11A. The hinged vertical plane A-A' is the plane of the schematic vertical cross-sectional view of FIG. 11A.
Figure 11C:
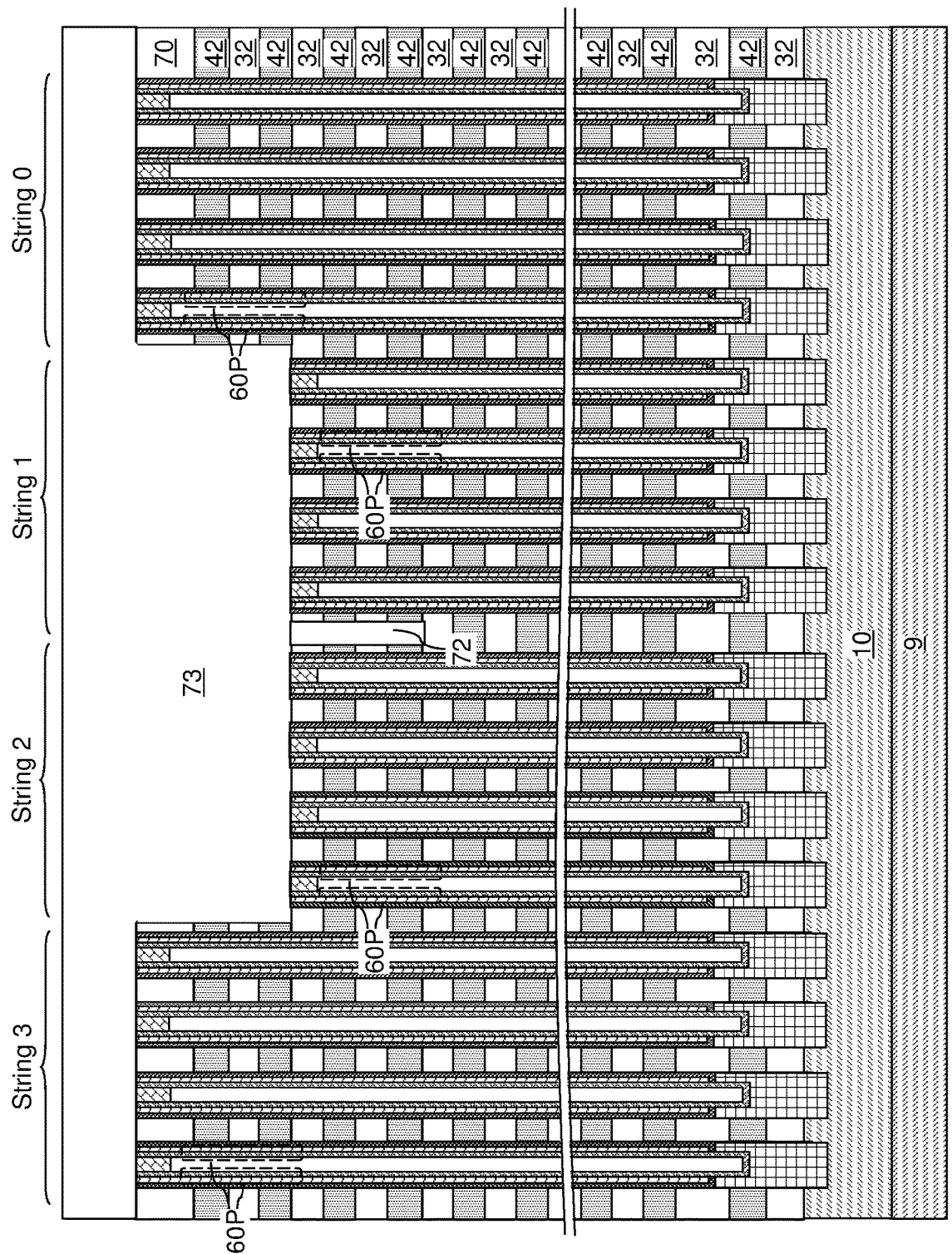
FIG. 11C is a schematic vertical cross-sectional view of the exemplary structure along the hinged vertical plane C-C' of FIG. 11B.

Referring to FIGS. 11A-11C, a dielectric cap material layer 73 is formed over the alternating stack (32, 42) by depositing a dielectric material. The dielectric material of the dielectric cap material layer 73 can be a planarizable dielectric material such as silicon oxide, or can be a self-planarizing dielectric material such as flowable oxide (FOX). The dielectric cap material layer 73 fills the recess regions 127 and overlies a top surface of the insulating cap layer 70 and a top surface of the retro-stepped dielectric material portion 65. If the dielectric material is planarized, chemical mechanical planarization can be used to provide a planar top surface for the dielectric cap material layer 73.

The dielectric cap material layer 73 can include a first bottom surface contacting top surfaces of the first memory opening fill structures 58A, and a second bottom surface contacting top surfaces of the second memory opening fill structures 58B and located below the horizontal plane including the top surfaces of the first memory opening fill structures 58A. Each of the first memory opening fill structures 58A and the second memory opening fill structures 58B includes a respective drain region 63 contacting a top portion of a respective vertical semiconductor channel 60. The first bottom surface of the dielectric cap material layer 73 is formed directly on drain regions 63 of the first memory opening fill structures 58A. The second bottom surface of the dielectric cap material layer 73 is formed directly on drain regions 63 of the second memory opening fill structures 58B. The dielectric cap material layer 73 can be formed directly on top surfaces of the dielectric isolation structures 73. In this case, a dielectric isolation structure 73 can include a top surface that contacts the second bottom surface of the dielectric cap material layer 73.

In one embodiment, each of the vertical semiconductor channels 60 includes a respective pocket doping region 60P located directly underneath a respective drain region 63. Pocket doping regions 60P of vertical semiconductor channels 60 of the first memory opening fill structures 58 can be at least partly located above the horizontal plane including the second bottom surface of the dielectric cap material layer 73. Pocket doping regions 60P of vertical semiconductor channels 60 of the second memory opening fill structures 58B can be located entirely below the horizontal plane including the second bottom surface of the dielectric cap material layer 73.

A photoresist layer (not shown) can be applied over the dielectric cap material layer 73, and is lithographically patterned to form openings in areas between clusters of memory stack structures 55. The pattern in the photoresist layer can be transferred through the dielectric cap material layer 73, the alternating stack (32, 42) and/or the retro-stepped dielectric material portion 65 using an anisotropic etch to form backside trenches 79, which vertically extend from the top surface of the dielectric cap material layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The dielectric isolation structures 72 can laterally extend along the first horizontal direction hd1. Each backside trench 79 can have a uniform width that is invariant along the lengthwise direction (i.e., along the first horizontal direction hd1). Each dielectric isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a dielectric isolation structure 72, or between a neighboring pair of dielectric isolation structures 72. In one embodiment, the backside trenches 79 can include a source contact opening in which a source contact via structure can be subsequently formed. The photoresist layer can be removed, for example, by ashing.

Multiple strings of memory opening fill structures 58 can be present within each neighboring pair of backside trenches 79. Each string of memory opening fill structures 58 includes a respective plurality of rows of memory opening fill structures 58. Each row of memory opening fill structures 58 laterally extends along the first horizontal direction hd1 that is parallel to the lengthwise direction of the backside trenches 79. The multiple rows within each string can be laterally spaced apart along the second horizontal direction hd2. Each string of memory opening fill structures 58 can be laterally spaced from each neighboring string of memory opening fill structures 58 by a backside trench 79, by a dielectric isolation structure 72, or by a sidewall of the dielectric cap material layer 73 that vertically extends between a top surface of the insulating cap layer 70 and a bottom surface of the dielectric cap layer 73 contacting a top surface of an insulating layer 32 and a top surface of a dielectric isolation structure 72.

Each string of memory opening fill structures 58 includes only one drain region 63 to be electrically connected to any given bit line to be subsequently formed. In one embodiment, drain regions 63 within a string of memory opening fill structures 58 are subsequently connected to different bit lines with a one-to-one correspondence. In other words, no more than one drain region 63 within each string of memory opening fill structures 58 is subsequently connected to any bit line, and only one bit line is subsequently connected per each drain region in a string of memory opening fill structures 58. Each bit line can be connected to one drain region 63 per string of memory opening fill structures 58.

In one embodiment, if four strings are provided between a neighboring pair of backside trenches 79, string 0, string 1, string 2, and string 3 can be sequentially provided from one side to another between the neighboring pair of backside trenches 79. In this case, string 0 can be laterally bounded by a first backside trench 79 and a first sidewall of the dielectric cap layer 73, string 1 can be laterally bounded by the first sidewall of the dielectric cap layer 73 and a dielectric isolation structure 72, string 2 can be laterally bounded by the dielectric isolation structure 72 and a second sidewall of the dielectric cap layer 73, and string 3 can be laterally bounded by the second sidewall of the dielectric cap layer 73 and a second backside trench 79.

Figure 12:
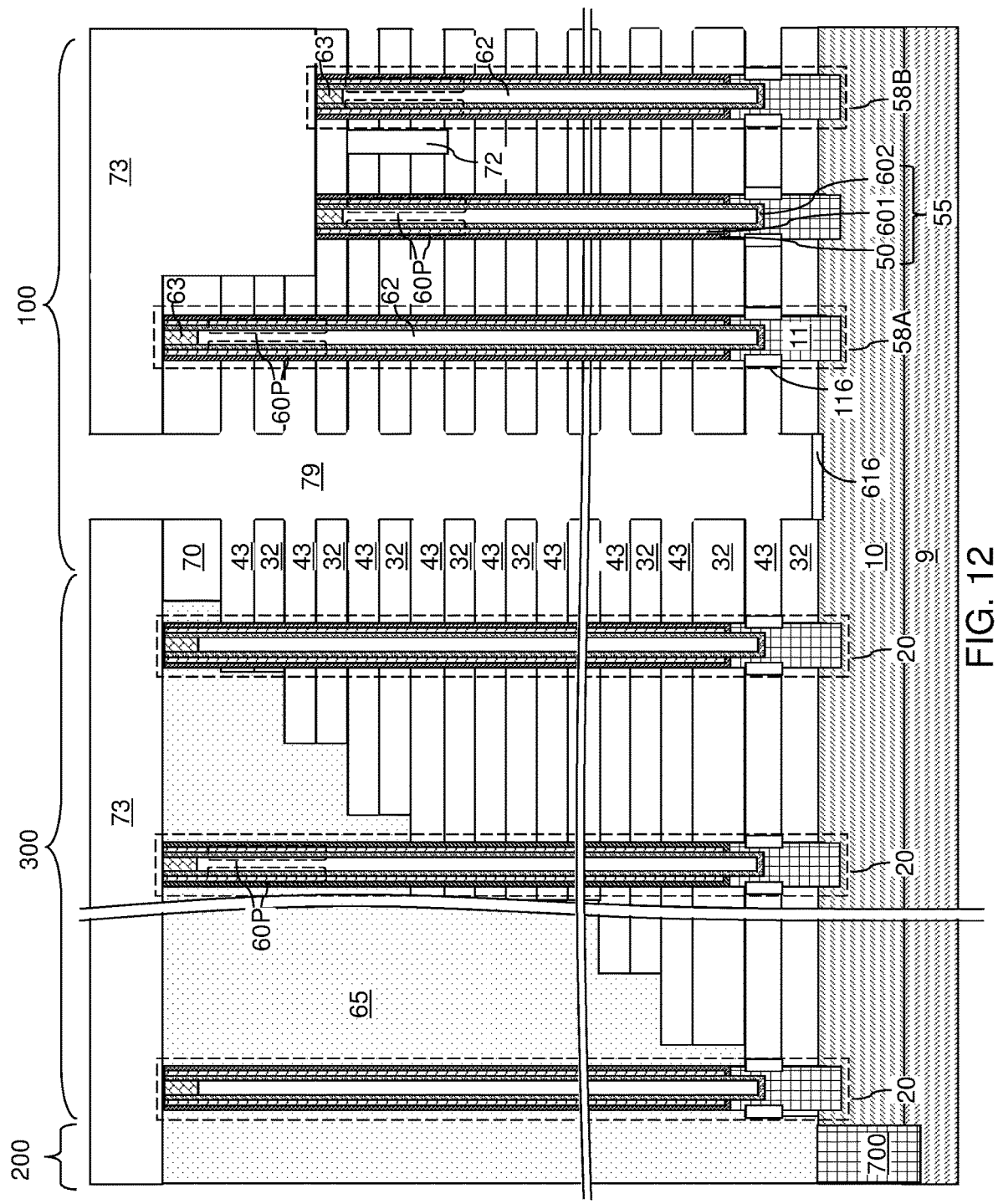
FIG. 12 is a schematic vertical cross-sectional view of the exemplary structure after formation of backside recesses according to an embodiment of the present disclosure.

Referring to FIGS. 12 and 13A, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the dielectric cap layer 73, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 13B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 13C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 14:
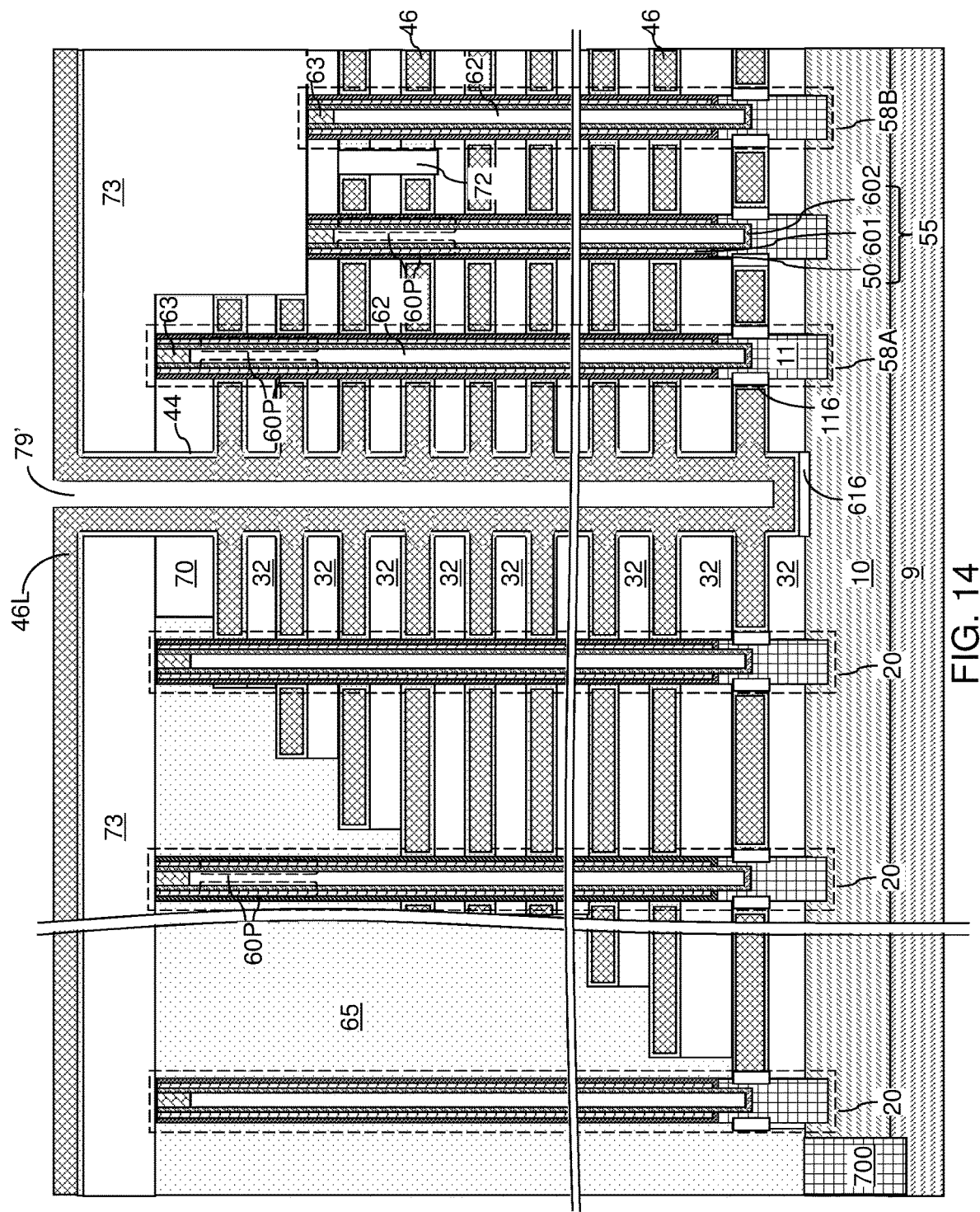
FIG. 14 is a schematic vertical cross-sectional view of the exemplary structure at the processing step of FIG. 13D.

Referring to FIGS. 13D and 14, a metal fill material is deposited in the plurality of backside recesses 43, on the sidewalls of the at least one the backside trench 79, and over the top surface of the dielectric cap material layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the dielectric cap material layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the dielectric cap material layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 15:
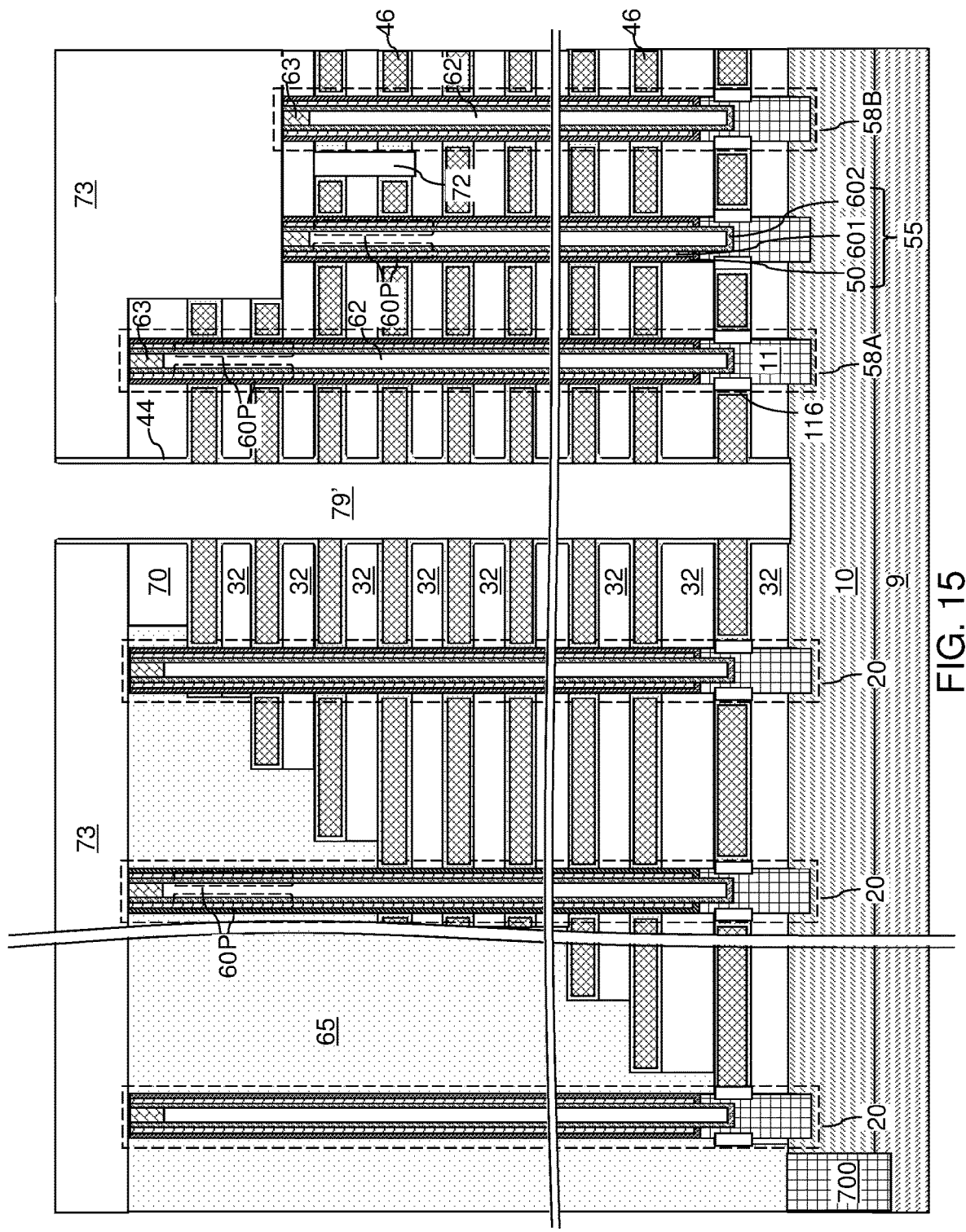
FIG. 15 is a schematic vertical cross-sectional view of the exemplary structure after removal of a deposited conductive material from within the backside trench according to an embodiment of the present disclosure.
Figure 16A:
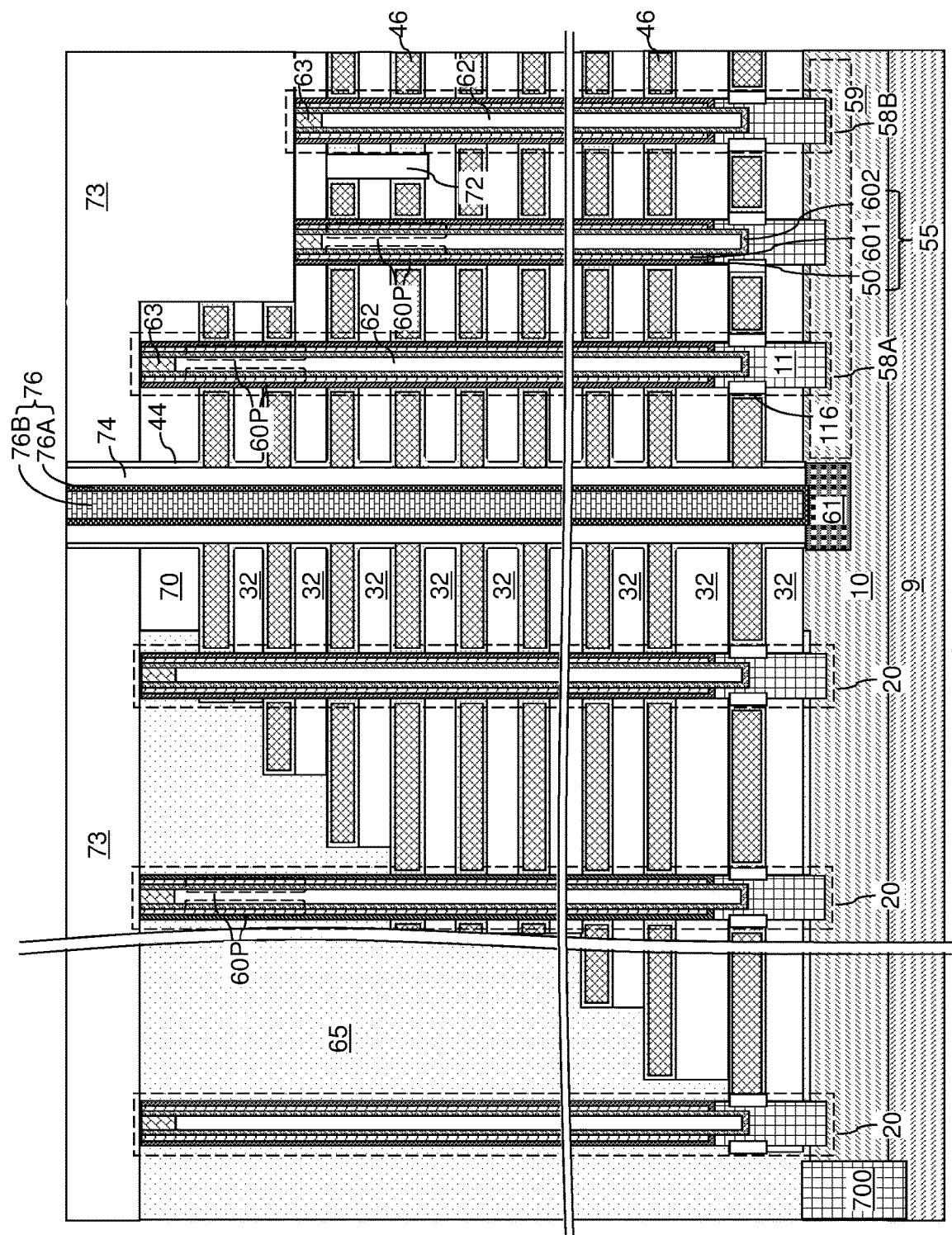
FIG. 16A is a schematic vertical cross-sectional view of the exemplary structure after formation of an insulating spacer and a backside contact structure according to an embodiment of the present disclosure.
Figure 16B:
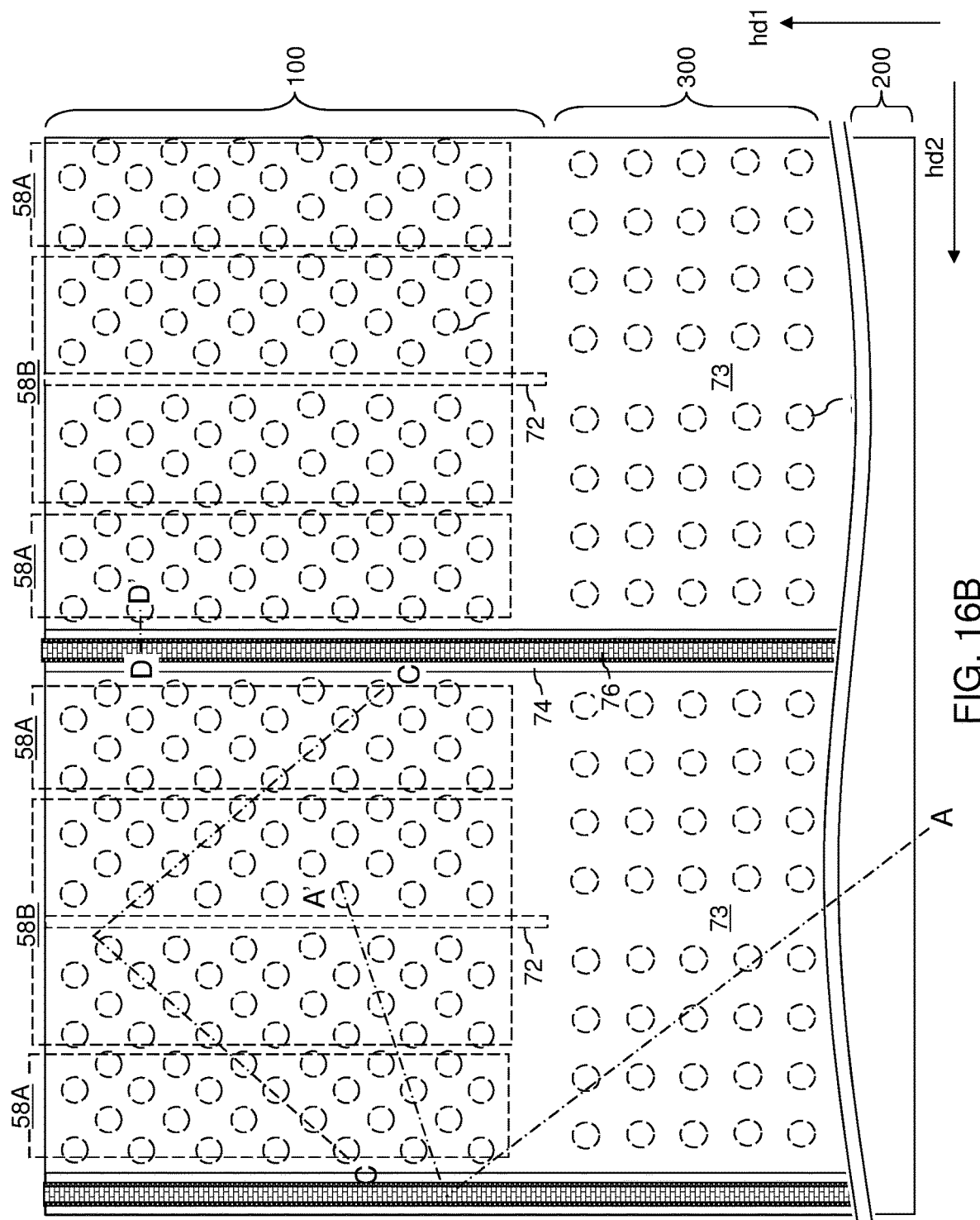
FIG. 16B is a partial see-through top-down view of the exemplary structure of FIG. 16A. The hinged vertical plane A-A' is the plane of the schematic vertical cross-sectional view of FIG. 16A.
Figure 16C:
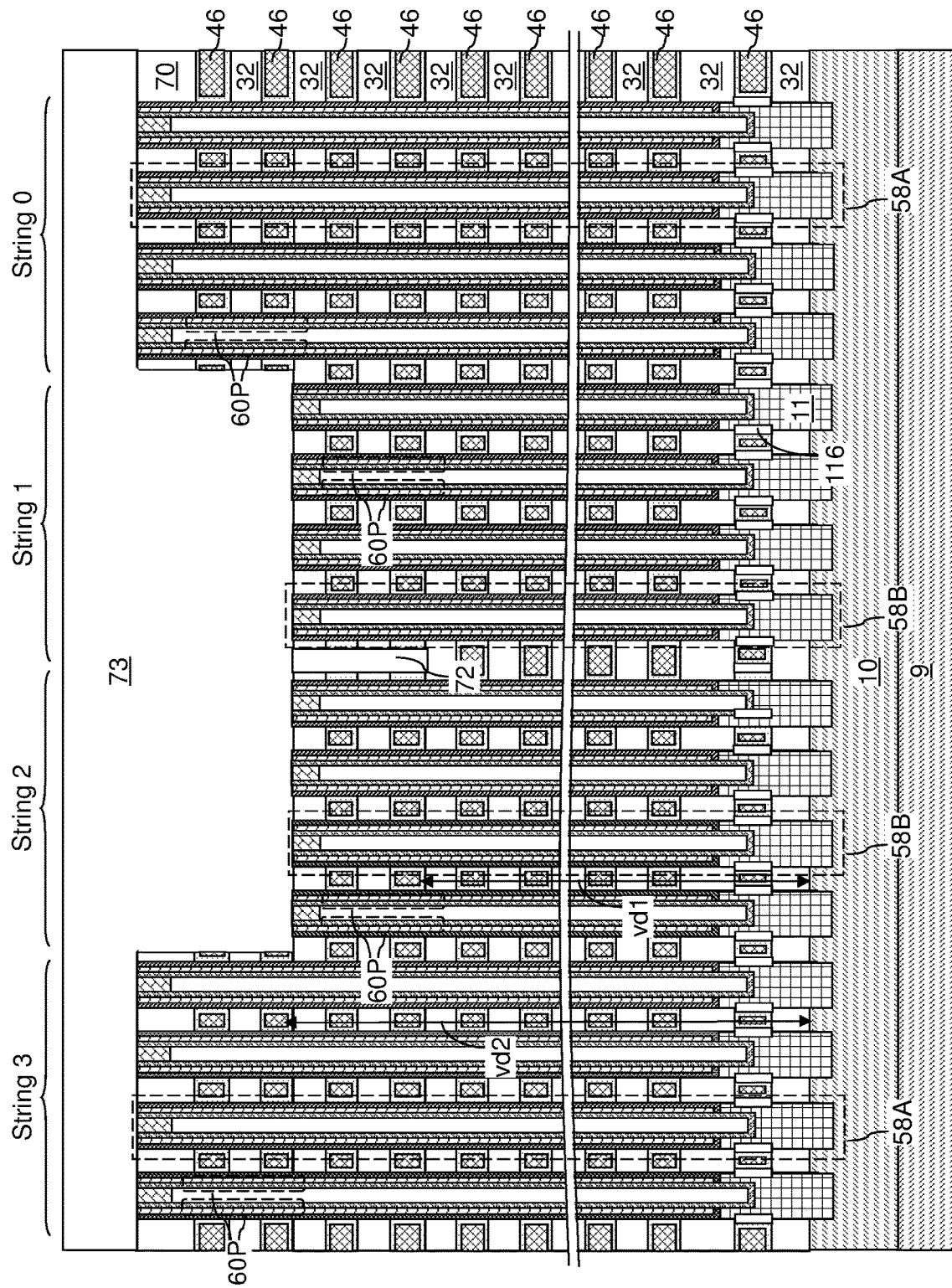
FIG. 16C is a schematic vertical cross-sectional view of the exemplary structure along the hinged vertical plane C-C' of FIG. 16B.
Figure 16D:
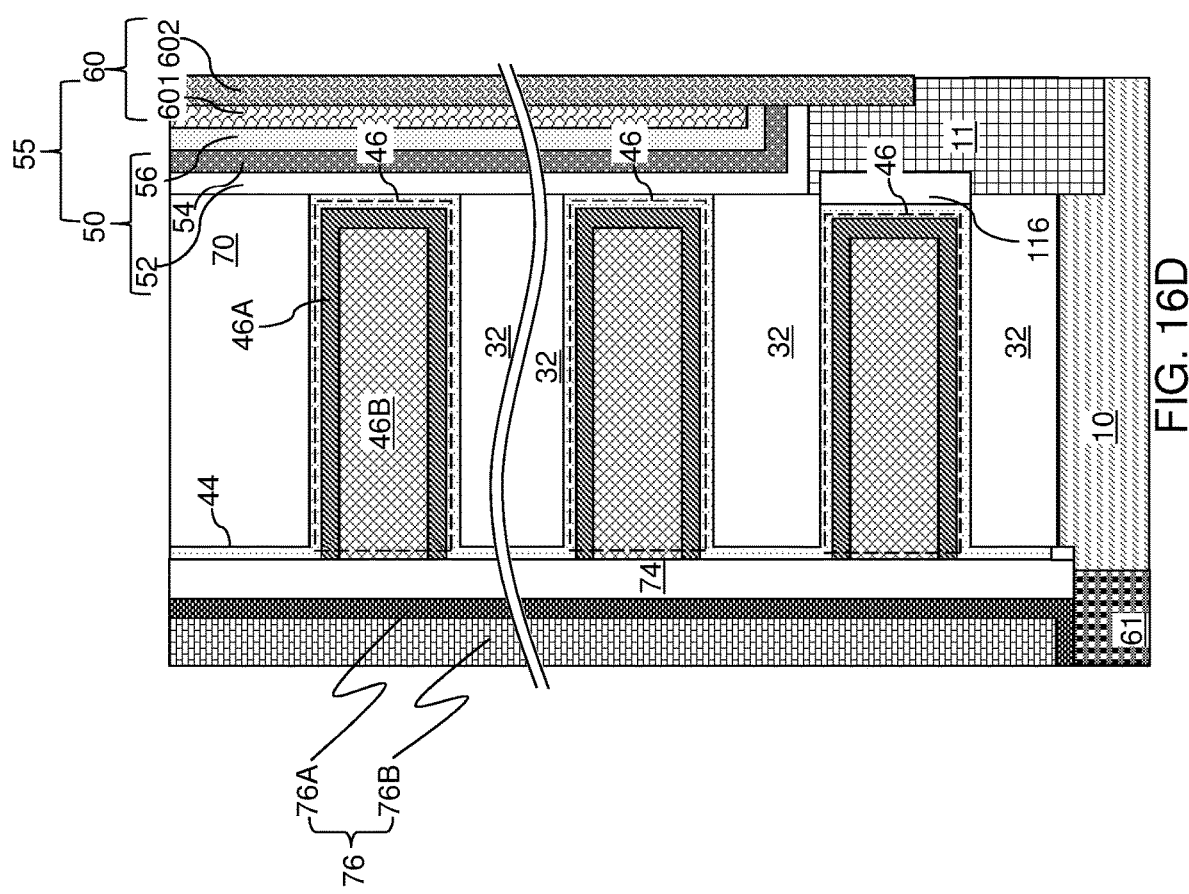
FIG. 16D is a magnified view of a region of the exemplary structure of FIG. 15A.

Referring to FIG. 15, the deposited metallic material of the continuous electrically conductive material layer 46L is etched back from the sidewalls of each backside trench 79 and from above the dielectric cap material layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Referring to FIGS. 16A-16D, an insulating material layer can be formed in the backside trenches 79 and over the dielectric cap material layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the dielectric cap material layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the dielectric cap material layer 73 overlying the alternating stack (32, 46) as a stopping layer. If chemical mechanical planarization (CMP) process is used, the dielectric cap material layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Figure 17A:
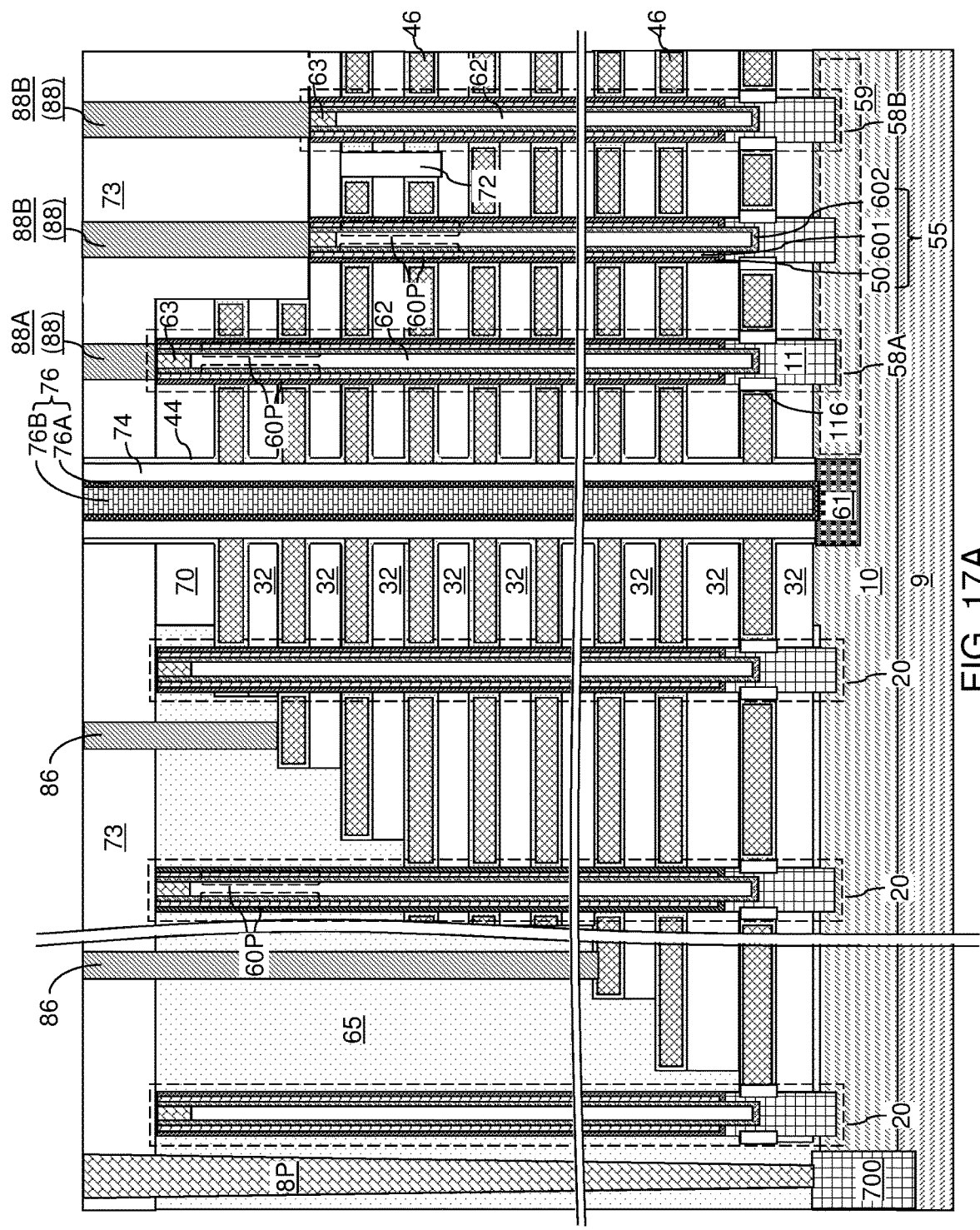
FIG. 17A is a schematic vertical cross-sectional view of the exemplary structure after formation of additional contact via structures according to an embodiment of the present disclosure.
Figure 17B:
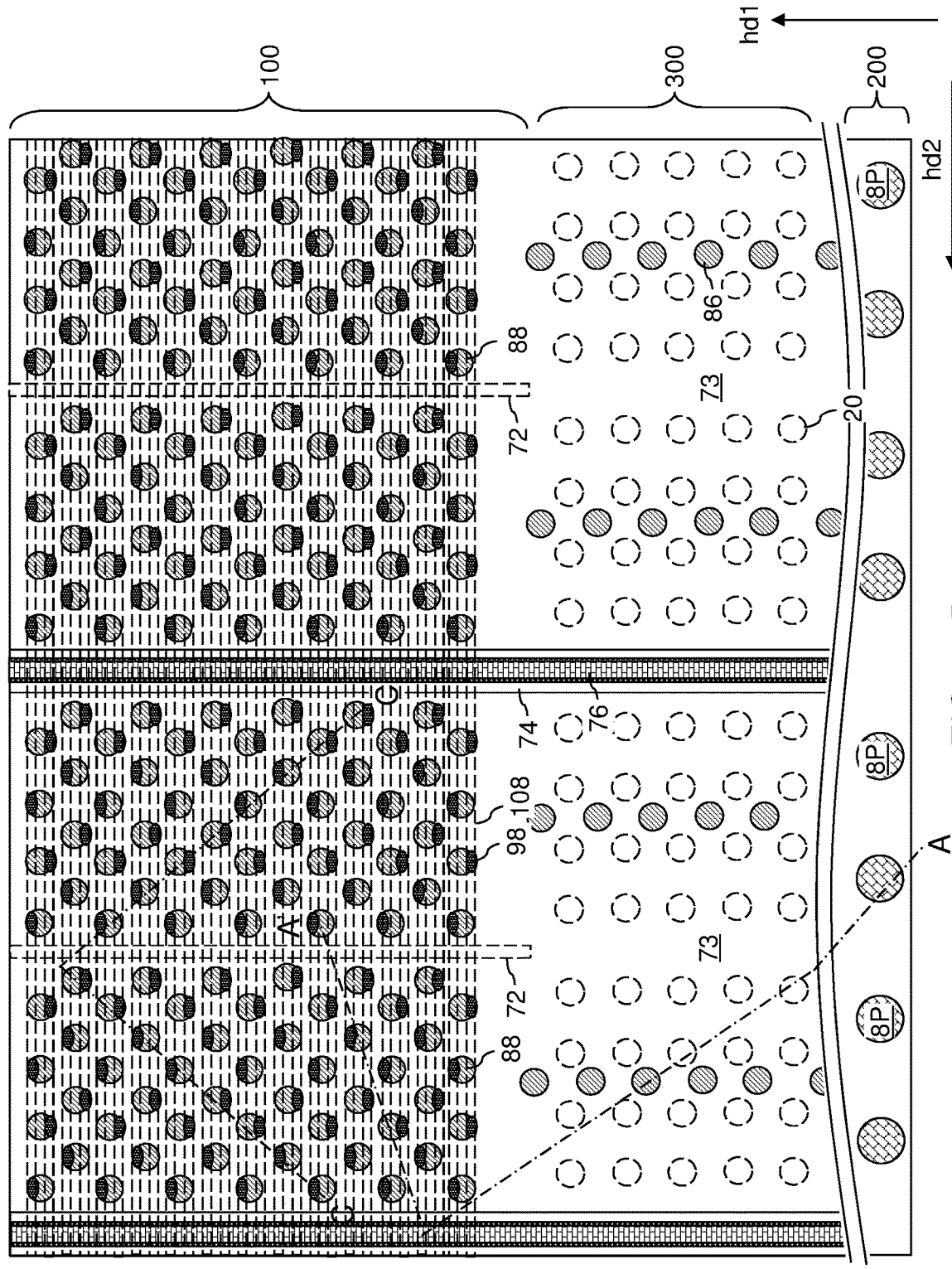
FIG. 17B is a partial see-through top-down view of the exemplary structure of FIG. 17A. The hinged vertical plane A-A' is the plane of the schematic vertical cross-sectional view of FIG. 17A.
Figure 17C:
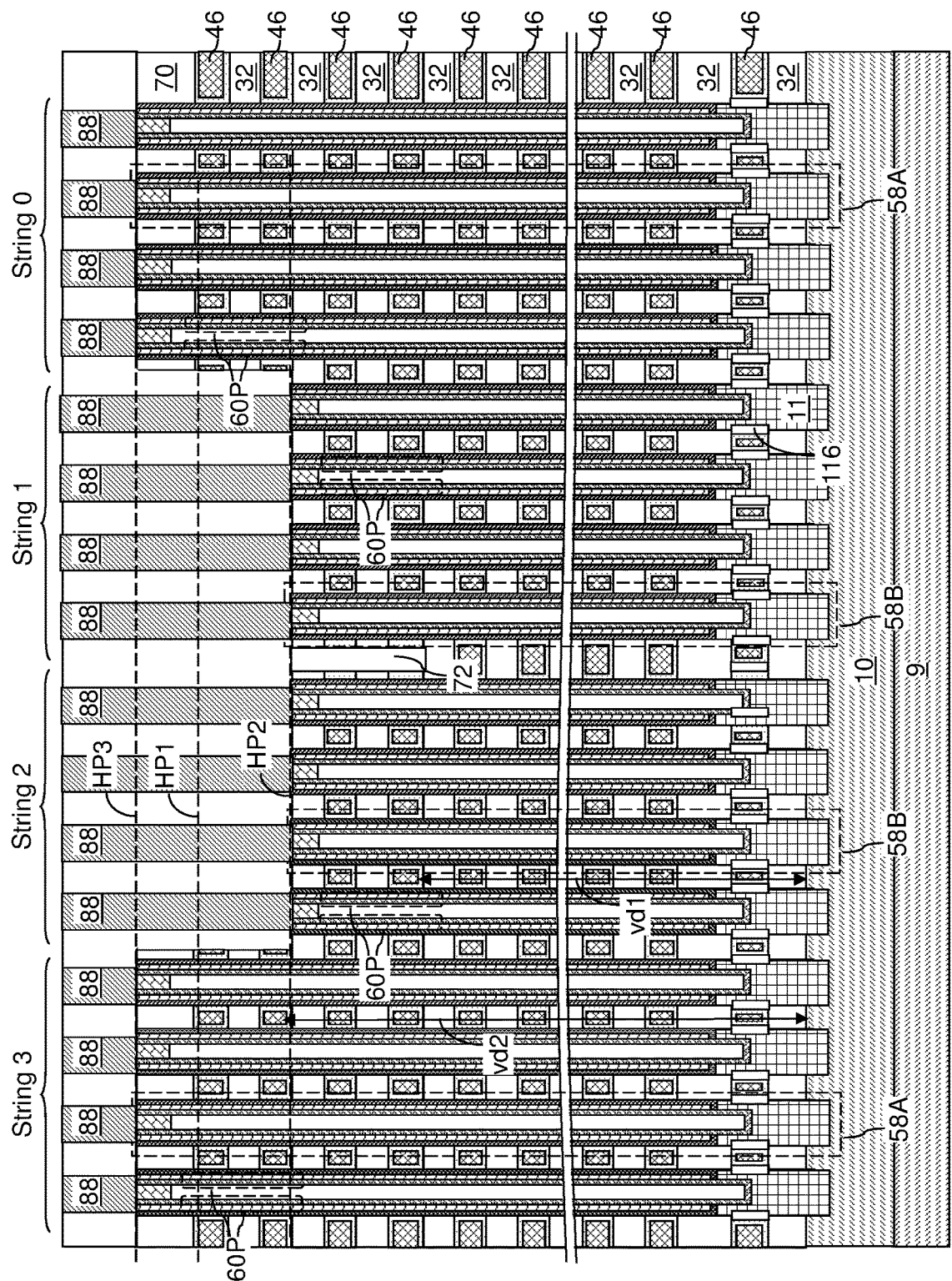
FIG. 17C is a schematic vertical cross-sectional view of the exemplary structure along the hinged vertical plane C-C' of FIG. 17B.

Referring to FIGS. 17A-17C, additional contact via structures (88, 86, 8P) can be formed through the dielectric cap material layer 73, and optionally through the retro-stepped dielectric material portion 65. For example, drain contact via structures 88 can be formed through the dielectric cap material layer 73 on each drain region 63. Word line contact via structures 86 can be formed on the electrically conductive layers 46 through the dielectric cap material layer 73, and through the retro-stepped dielectric material portion 65. Peripheral device contact via structures 8P can be formed through the retro-stepped dielectric material portion 65 directly on respective nodes of the peripheral devices.

The drain contact via structures 88 include first contact via structures 88A that are formed on each of the first memory opening fill structures 58A and second contact via structures 88B that are formed on each of the second memory opening fill structures 58B simultaneously with formation of the first contact via structures 88A. Top surfaces of the first contact via structures 88A can be formed within a same horizontal plane as top surfaces of the second contact via structures 88B such as the top surface of the dielectric cap material layer 73.

A plurality of bit lines 108 laterally extending along the second horizontal direction hd2 can be formed on the drain contact via structures 88. Optionally, connection via structures 98 may be formed on each of the drain contact via structures 88, and the plurality of bit lines 108 can be formed on a respective subset of the connection via structures. The plurality of bit lines 108 are electrically connected to upper ends of a respective plurality of vertical semiconductor channels 60. Each upper end of the vertical semiconductor channels 60 can be electrically connected to a respective one of the bit lines 108, and each of the bit lines 108 can be electrically connected to upper ends of at least one vertical semiconductor channel 60 of the first memory opening fill structures 58A and at least one vertical semiconductor channel 60 of the second memory opening fill structures 58B. In one embodiment, each bit line 108 can be electrically connected to an upper end of one vertical semiconductor channel 60 per string of memory opening fill structures 58. Each drain region 63 in a string of memory opening fill structures 58 can be electrically connected to a respective one of the plurality of bit lines 108 and one drain region 63 per each string within all other strings of memory opening fill structures 58.

Figure 18:
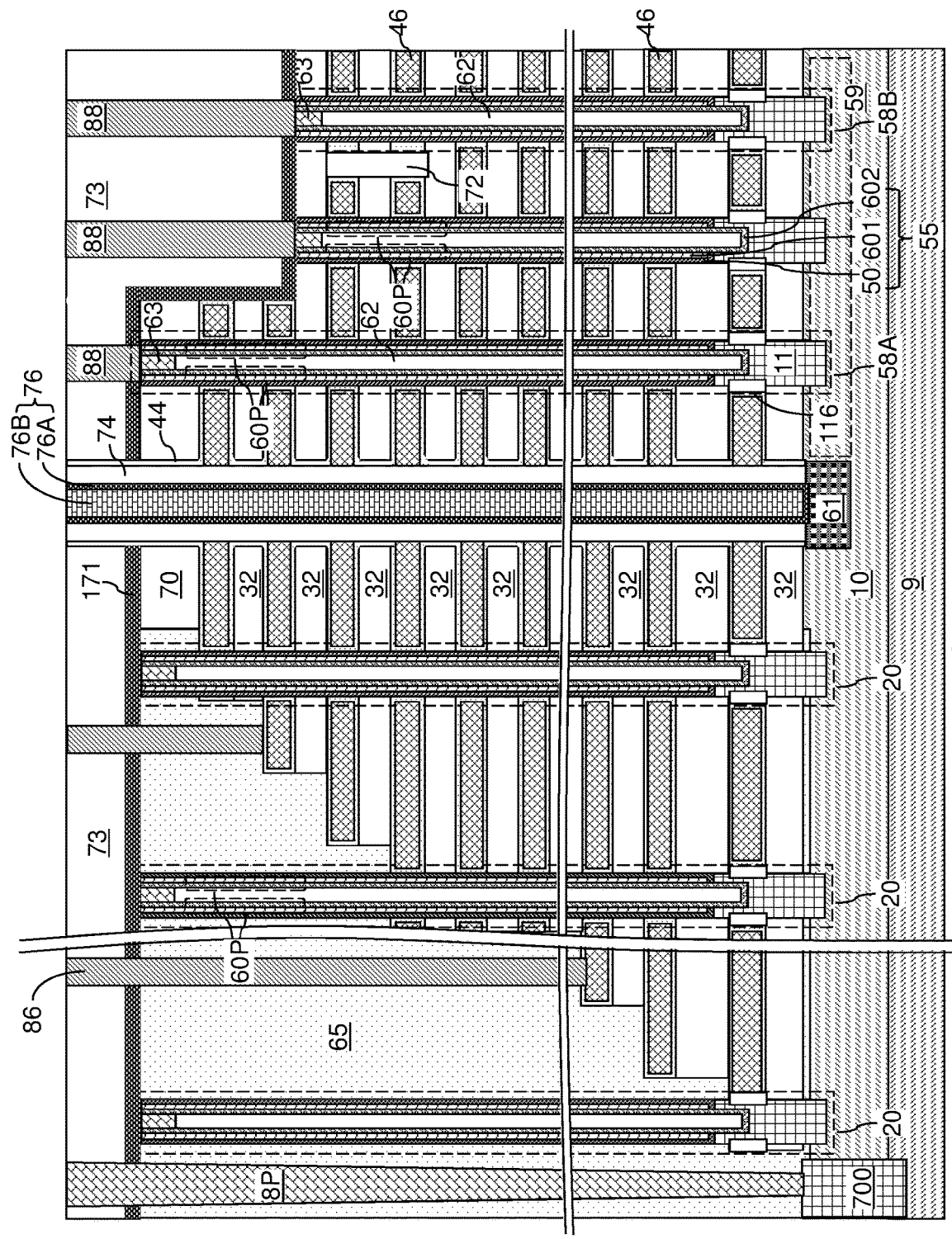
FIG. 18 is a schematic vertical cross-sectional view of an alternative configuration of the exemplary structure according to an embodiment of the present disclosure.

Referring to FIG. 18, an alternative configuration of the exemplary structure is illustrated, which can be derived from the exemplary structure of FIGS. 17A-17C by forming an etch stop layer 171 after the processing steps of FIGS. 10A and 10B and prior to formation of the dielectric cap material layer 73 by deposition and planarization of a dielectric material. In one embodiment, the etch stop layer 171 can be formed by conformal deposition of a dielectric material such as a dielectric metal oxide. In an illustrative example, a conformal aluminum oxide layer can be deposited by a conformal deposition process such as atomic layer deposition (ALD) on the physically exposed surfaces of the alternating stack (32, 42) after the processing steps of FIGS. 10A and 10B. The thickness of the etch stop layer 171 can be in a range from 1 nm to 20 nm, such as from 2 nm to 10 nm, although lesser and greater thicknesses can also be used. Subsequently, the processing steps of FIGS. 11A-11C through FIGS. 17A-17C can be performed with appropriate modifications to etch recipes. The etch stop layer 171 can facilitate simultaneous formation of via cavities having different depths through the dielectric cap material layer 73. The etch recipes can include a respective step that etches through the etch stop layer 171 simultaneously.

Referring to all drawings and according to various embodiments of the present disclosure, a three-dimensional memory device is provided, which comprises: an alternating stack of insulating layers 32 and electrically conductive layers 46 located over a substrate (9, 10), wherein the alternating stack (32, 46) includes a first region R1 in which all layers of the alternating stack (32, 46) are present and a second region R2 in which at least a topmost one of the electrically conductive layers 46 is absent; first memory opening fill structures 58A extending through the first region R1 of the alternating stack (32, 46); and second memory opening fill structures 58B extending through the second region R2 of the alternating stack (32, 46), wherein each of the first memory opening fill structures 58A and the second memory opening fill structures 58B comprises a respective memory film 50 and a respective vertical semiconductor channel 60 that is laterally surrounded by the respective memory film 50.

In one embodiment, top surfaces of the first memory opening fill structures 58A are located above a horizontal plane (such as a first horizontal plane HP1 illustrated in FIG. 17C) including a top surface of the topmost one of the electrically conductive layers 46; and top surfaces of the second memory opening fill structures 58B are located below the horizontal plane. In one embodiment, each of the first memory opening fill structures 58A and the second memory opening fill structures 58B comprises a respective drain region 63; drain regions 63 of the first memory opening fill structures are located above the horizontal plane (such as the first horizontal plane HP1 illustrated in FIG. 17C); and drain regions of the second memory opening fill structures 58B are located below the horizontal plane.

In one embodiment, a dielectric cap material layer 73 overlies the alternating stack (32, 46). The dielectric cap material layer 73 can comprise: a first bottom surface contacting top surfaces of the first memory opening fill structures 58 and located within a horizontal plane (such as a third horizontal plane HP3 illustrated in FIG. 17C); and a second bottom surface contacting top surfaces of the second memory opening fill structures 58B and located below the horizontal plane (such as the third horizontal plane HP3 illustrated in FIG. 17C) including the top surfaces of the first memory opening fill structures 58A and located within another horizontal plane (such as a second horizontal plane HP2 illustrated in FIG. 17C).

In one embodiment, each of the first memory opening fill structures 58A and the second memory opening fill structures 58B comprises a respective drain region 63 contacting a top portion of a respective vertical semiconductor channel 60; the first bottom surface of the dielectric cap material layer 73 contacts drain regions 73 of the first memory opening fill structures 58A, for example, at the third horizontal plane HP3; and the second bottom surface of the dielectric cap material layer 73 contacts drain regions 63 of the second memory opening fill structures 58B, for example, at the second horizontal plane HP3.

In one embodiment, each of the vertical semiconductor channels 60 comprises a respective pocket doping region 60P located directly underneath a respective drain region 63. Pocket doping regions 60P of vertical semiconductor channels 60 of the first memory opening fill structures 58A are located at least partly above a horizontal plane (such as the second horizontal plane HP2) including the second bottom surface of the dielectric cap material layer 73, and can be located entirely above a horizontal plane including a bottom surface of one of the insulating layers 32 that contacts the second bottom surface of the dielectric cap material layer 73. Pocket doping regions 60P of vertical semiconductor channels 60 of the second memory opening fill structures 58B are located below the horizontal plane (such as the second horizontal plane HP2) including the second bottom surface of the dielectric cap material layer 73.

In one embodiment, a vertical dopant concentration profile for the pocket doping regions 60P of the vertical semiconductor channels 60 of the second memory opening fill structures 58B matches, and is vertically shifted from, a vertical dopant concentration profile for the pocket doping regions 60P of the vertical semiconductor channels 60 of the first memory opening fill structures 58A.

In one embodiment, a first subset of electrically conductive layers 46 is present within the alternating stack (32, 46) above the horizontal plane (such as the second horizontal plane HP2) including the second bottom surface of the dielectric cap material layer 73. The pocket doping regions 60P of the vertical semiconductor channels 60 of the first memory opening fill structures 58A vertically extends through the first subset of electrically conductive layers 46. The pocket doping regions 60P of the vertical semiconductor channels 60 of the second memory opening fill structures 58B vertically extends through a second subset of electrically conductive layers 46 located below the horizontal plane (such as the second horizontal plane HP2) including the second bottom surface of the dielectric cap material layer 73. In one embodiment, the first subset of electrically conductive layers 46 (through which the pocket doping regions 60P of the vertical semiconductor channels 60 of the first memory opening fill structures 58A vertically extends) includes a same number of electrically conductive layers 46 as the second subset of electrically conductive layers 46 (through which pocket doping regions 60P of the vertical semiconductor channels 60 of the second memory opening fill structures 58B vertically extends).

In one embodiment, first regions of the vertical semiconductor channels 60 (such as the pocket doping regions 60P) of the first memory opening fill structures 58A that are laterally surrounded by the first subset of electrically conductive layers 46 have a first threshold voltage, and second regions of the vertical semiconductor channels 60 of the first memory opening fill structures 58A that are laterally surrounded by the second subset of electrically conductive layers 46 (that underlie the first subset of the electrically conductive layers 46 and laterally surround portions of the vertical semiconductor channels 60 that underlie the pocket doping regions 60P of the first memory opening fill structures 58A) have a second threshold voltage that is lower than the first threshold voltage. Regions of the vertical semiconductor channels 60 of the second memory opening fill structures 58B that are laterally surrounded by the second subset of electrically conductive layers 46 have the first threshold voltage.

Application of a bias voltage that is between the first threshold voltage and the second threshold voltage to the second subset of electrically conductive layers 46 turns on portions of the vertical semiconductor channels 60 of the first memory opening fill structures 58A at the levels of the second subset of electrically conductive layers 46, and turns off portions of the vertical semiconductor channels of the second memory opening fill structures 58B at the levels of the second subset of electrically conductive layers 46. By applying a bias voltage that is above the first threshold voltage to the first subset of electrically conductive layers 46, a string of first memory opening fill structures 58A can be turned on while an adjacent string of second memory opening fill structures 58B is turned off. The adjacent string of second memory opening fill structures 58B can be turned on by applying a bias voltage greater than the first threshold voltage to the second subset of electrically conductive layers 46, while the string of first memory opening fill structures is turned off by application of a bias voltage lower than the first threshold voltage to the first subset of electrically conductive layers 46.

The dielectric isolation structures 72 can divide the electrically conductive layers 46 at the levels of the first subset of electrically conductive layers 46 and the second subset of electrically conductive layers 46. Thus, each pair of a string of first memory opening fill structures 58A and a string of second memory opening fill structures 58B located between a backside trench 79 and a dielectric isolation structure 72 or located between a neighboring pair of dielectric isolation structures 72 can be selected by applying bias voltages to a corresponding first subset of electrically conductive layers 46 and a corresponding second subset of electrically conductive layers 46. A combination of a first bias voltage greater than the first threshold voltage to the first subset of electrically conductive layers 46 and a second bias voltage higher than the second threshold voltage and lower than the first threshold voltage to the second subset of electrically conductive layers 46 turns on a string of first memory opening fill structures 58A and turns off an adjacent string of second memory opening fill structures 58B. A combination of a first bias voltage lower than the first threshold voltage to the first subset of electrically conductive layers 46 and a second bias voltage higher than the first threshold voltage to the second subset of electrically conductive layers 46 turns on a string of second memory opening fill structures 58B and turns off a string of first memory opening fill structures 58A.

In one embodiment, the three-dimensional memory device comprises a dielectric isolation structure 72 comprising a dielectric material and including a top surface that contacts the second bottom surface of the dielectric cap material layer 73. In one embodiment, the second subset of electrically conductive layers 46 laterally surrounds each of the first memory opening fill structures 58A underneath the first subset of electrically conductive layers 46.

In one embodiment, the first memory opening fill structures 58A are arranged in a first two-dimensional array; the second memory opening fill structures 58B are arranged in a second two-dimensional array; and the first two-dimensional array and the second two-dimensional array have a same two-dimensional periodicity and are on-pitch with respect to each other.

In one embodiment, a plurality of bit lines 108 are electrically connected to upper ends of a respective plurality of vertical semiconductor channels 60. Each upper end of the vertical semiconductor channels 60 is electrically connected to a respective one of the bit lines 108, and each of the bit lines 108 is electrically connected to upper ends of at least one vertical semiconductor channel 60 of the first memory opening fill structures 58A and at least one vertical semiconductor channel 60 of the second memory opening fill structures 58B. Each of the bit lines 108 can be electrically connected to an upper end of only one vertical semiconductor channel 60 per string of memory opening fill structures 58.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Referring to all drawings and according to various embodiments of the present disclosure, a method of forming a three-dimensional memory device is provided, which comprises forming an alternating stack of insulating layers and spacer material layers, wherein the spacer material layers are formed as, or are subsequently replaced with, electrically conductive layers; forming a recess region within the alternating stack by masking a first region of the alternating stack and recessing a second region of the alternating stack to remove at least one spacer material layer from the second region; forming memory opening fill structures through the alternating stack, wherein the memory opening fill structures comprise first memory opening fill structures extending through the first region of the alternating stack and second memory opening fill structures extending through the second region of the alternating stack, wherein each of the first memory opening fill structures and the second memory opening fill structures comprises a respective memory film and a respective vertical semiconductor channel that is laterally surrounded by the respective memory film. In one embodiment, top surfaces of the first memory opening fill structures are formed within a horizontal plane that is located above another horizontal plane including top surfaces of the second memory opening fill structures.

In an embodiment, the method further comprises forming first contact via structures on each of the first memory opening fill structures, and forming second contact via structures on each of the second memory opening fill structures simultaneously with formation of the first contact via structures, wherein top surfaces of the first contact via structures are formed within a same horizontal plane as top surfaces of the second contact via structures.

In an embodiment, the method further comprises forming a dielectric cap material layer over the alternating stack, wherein the dielectric cap material layer comprises a first bottom surface contacting top surfaces of the first memory opening fill structures, and a second bottom surface contacting top surfaces of the second memory opening fill structures and located below a horizontal plane including the top surfaces of the first memory opening fill structures. In the embodiment method, each of the first memory opening fill structures and the second memory opening fill structures comprises a respective drain region contacting a top portion of a respective vertical semiconductor channel, the first bottom surface of the dielectric cap material layer is formed directly on drain regions of the first memory opening fill structures, and the second bottom surface of the dielectric cap material layer is formed directly on drain regions of the second memory opening fill structures. In one embodiment, the method further comprises forming a dielectric isolation structure in an upper portion of the alternating stack, and removing an upper portion of the dielectric isolation structure concurrently with recessing of the second region of the alternating stack, wherein top surfaces of the second memory opening fill structures are formed in a same horizontal plane as a remaining portion of the dielectric isolation structure.

In an embodiment, the method further comprises implanting electrical dopants into upper regions of the vertical semiconductor channels, wherein: a respective pocket doping region is formed within each of the vertical semiconductor channels; pocket doping regions of vertical semiconductor channels of the first memory opening fill structures are formed at least partly above a horizontal plane including a recessed surface of the alternating stack that is formed in the recess region; and pocket doping regions of vertical semiconductor channels of the second memory opening fill structures are located below the horizontal plane including the recessed surface.

By vertically offsetting a first subset of electrically conductive layers from a second subset of electrically conductive layers present within the alternating stack by forming a first region in which all layers of the alternating stack are present and a second region in which at least a topmost one of the electrically conductive layers is absent, manufacturing methods are simplified. All strings can be reached for metal replacement during fabrication steps. This lowers costs by avoiding extra processing steps and reducing mis-landing issues, and may provide improved memory performance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate, wherein the alternating stack includes a first region in which all layers of the alternating stack are present and a second region in which at least a topmost one of the electrically conductive layers is absent;
   first memory opening fill structures extending through the first region of the alternating stack; and
   second memory opening fill structures extending through the second region of the alternating stack, wherein each of the first memory opening fill structures and the second memory opening fill structures comprises a respective memory film and a respective vertical semiconductor channel that is laterally surrounded by the respective memory film,
   wherein the three-dimensional memory device further comprises at least one feature selected from:
   a first feature that top surfaces of the first memory opening fill structures are located above a horizontal plane including a top surface of the topmost one of the electrically conductive layers, and top surfaces of the second memory opening fill structures are located below the horizontal plane; or
   a second feature that the three-dimensional memory device further comprises a dielectric cap material layer, which overlies the alternating stack and comprises a first bottom surface contacting top surfaces of the first memory opening fill structures, and a second bottom surface contacting top surfaces of the second memory opening fill structures and located below a horizontal plane including the top surfaces of the first memory opening fill structures.

2. The three-dimensional memory device of claim 1, wherein the three-dimensional memory device comprises the first feature.

3. The three-dimensional memory device of claim 2, wherein:
each of the first memory opening fill structures and the second memory opening fill structures comprises a respective drain region;
drain regions of the first memory opening fill structures are located above the horizontal plane; and
drain regions of the second memory opening fill structures are located below the horizontal plane.

4. The three-dimensional memory device of claim 1, wherein the three-dimensional memory device comprises the second feature.

5. The three-dimensional memory device of claim 4, wherein:
each of the first memory opening fill structures and the second memory opening fill structures comprises a respective drain region contacting a top portion of a respective vertical semiconductor channel;
the first bottom surface of the dielectric cap material layer contacts drain regions of the first memory opening fill structures; and
the second bottom surface of the dielectric cap material layer contacts drain regions of the second memory opening fill structures.

6. The three-dimensional memory device of claim 5, wherein:
each of the vertical semiconductor channels comprises a respective pocket doping region located directly underneath a respective drain region;
pocket doping regions of vertical semiconductor channels of the first memory opening fill structures are located above a horizontal plane including the second bottom surface of the dielectric cap material layer; and
pocket doping regions of vertical semiconductor channels of the second memory opening fill structures are located below the horizontal plane including the second bottom surface of the dielectric cap material layer.

7. The three-dimensional memory device of claim 6, wherein a vertical dopant concentration profile for the pocket doping regions of the vertical semiconductor channels of the second memory opening fill structures matches, and is vertically shifted from, a vertical dopant concentration profile for the pocket doping regions of the vertical semiconductor channels of the first memory opening fill structures.

8. The three-dimensional memory device of claim 6, wherein:
a first subset of electrically conductive layers is present within the alternating stack above the horizontal plane including the second bottom surface of the dielectric cap material layer;
the pocket doping regions of the vertical semiconductor channels of the first memory opening fill structures vertically extends through the first subset of electrically conductive layers;
the pocket doping regions of the vertical semiconductor channels of the second memory opening fill structures vertically extends through a second subset of electrically conductive layers located below the horizontal plane including the second bottom surface of the dielectric cap material layer; and
the first subset of electrically conductive layers includes a same number of electrically conductive layers as the second subset of electrically conductive layers.

9. The three-dimensional memory device of claim 8, wherein:
first regions of the vertical semiconductor channels of the first memory opening fill structures that are laterally surrounded by the first subset of electrically conductive layers have a first threshold voltage;
second regions of the vertical semiconductor channels of the first memory opening fill structures that are laterally surrounded by the second subset of electrically conductive layers have a second threshold voltage that is lower than the first threshold voltage; and
regions of the vertical semiconductor channels of the second memory opening fill structures that are laterally surrounded by the second subset of electrically conductive layers have the first threshold voltage.

10. The three-dimensional memory device of claim 8, further comprising a dielectric isolation structure comprising a dielectric material and including a top surface that contacts the second bottom surface of the dielectric cap material layer.

11. The three-dimensional memory device of claim 8, wherein the second subset of electrically conductive layers laterally surrounds each of the first memory opening fill structures.

12. The three-dimensional memory device of claim 1, wherein:
the first memory opening fill structures are arranged in a first two-dimensional array;
the second memory opening fill structures are arranged in a second two-dimensional array; and
the first two-dimensional array and the second two-dimensional array have a same two-dimensional periodicity and are on-pitch with respect to each other.

13. The three-dimensional memory device of claim 1, further comprising a plurality of bit lines electrically connected to upper ends of a respective plurality of vertical semiconductor channels,
wherein:
each upper end of the vertical semiconductor channels is electrically connected to a respective one of the bit lines; and
each of the bit lines is electrically connected to upper ends of at least one vertical semiconductor channel of the first memory opening fill structures and at least one vertical semiconductor channel of the second memory opening fill structures.

14. A method of forming a three-dimensional memory device, comprising:
forming an alternating stack of insulating layers and spacer material layers, wherein the spacer material layers are formed as, or are subsequently replaced with, electrically conductive layers;
forming a recess region within the alternating stack by masking a first region of the alternating stack and recessing a second region of the alternating stack to remove at least one spacer material layer from the second region; and
forming memory opening fill structures through the alternating stack, wherein the memory opening fill structures comprise first memory opening fill structures extending through the first region of the alternating stack and second memory opening fill structures extending through the second region of the alternating stack, wherein each of the first memory opening fill structures and the second memory opening fill structures comprises a respective memory film and a respective vertical semiconductor channel that is laterally surrounded by the respective memory film, wherein the method further comprises at least one feature selected from:

a first feature that top surfaces of the first memory opening fill structures are formed within a horizontal plane that is located above another horizontal plane including top surfaces of the second memory opening fill structures;

a second feature that that the method further comprises forming first contact via structures on each of the first memory opening fill structures, and forming second contact via structures on each of the second memory opening fill structures simultaneously with formation of the first contact via structures, wherein top surfaces of the first contact via structures are formed within a same horizontal plane as top surfaces of the second contact via structures;

a third feature that the method further comprises forming a dielectric cap material layer over the alternating stack, wherein the dielectric cap material layer comprises a first bottom surface contacting top surfaces of the first memory opening fill structures, and a second bottom surface contacting top surfaces of the second memory opening fill structures and located below a horizontal plane including the top surfaces of the first memory opening fill structures; or a fourth feature that the method further comprises implanting electrical dopants into upper regions of the vertical semiconductor channels, wherein a respective pocket doping region is formed within each of the vertical semiconductor channels, pocket doping regions of vertical semiconductor channels of the first memory opening fill structures are formed at least partly above a horizontal plane including a recessed surface of the alternating stack that is formed in the recess region, and pocket doping regions of vertical semiconductor channels of the second memory opening fill structures are located below the horizontal plane including the recessed surface.

15. The method of claim 14, wherein the method comprises the first feature.

16. The method of claim 14, wherein the method comprises the second feature.

17. The method of claim 14, wherein the method comprises the third feature.

18. The method of claim 17, wherein:

each of the first memory opening fill structures and the second memory opening fill structures comprises a respective drain region contacting a top portion of a respective vertical semiconductor channel;

the first bottom surface of the dielectric cap material layer is formed directly on drain regions of the first memory opening fill structures; and the second bottom surface of the dielectric cap material layer is formed directly on drain regions of the second memory opening fill structures.

19. The method of claim 17, further comprising:

forming a dielectric isolation structure in an upper portion of the alternating stack; and removing an upper portion of the dielectric isolation structure concurrently with recessing of the second region of the alternating stack, wherein top surfaces of the second memory opening fill structures are formed in a same horizontal plane as a remaining portion of the dielectric isolation structure.

20. The method of claim 14, wherein the method comprises the fourth feature.

* * * * *